(12) United States Patent
Ishikawa et al.

(10) Patent No.: US 6,930,761 B2
(45) Date of Patent: Aug. 16, 2005

(54) PROJECTING EXPOSURE APPARATUS

(75) Inventors: Hiromi Ishikawa, Kanagawa-ken (JP); Masahiro Ohba, Kanagawa-ken (JP); Norihisa Takada, Kanagawa-ken (JP); Yutaka Korogi, Kanagawa-ken (JP)

(73) Assignee: Fuji Photo Film Co., Ltd., Kanagawa-ken (JP)

( * ) Notice: Subject to any disclaimer, the term of this patent is extended or adjusted under 35 U.S.C. 154(b) by 0 days.

(21) Appl. No.: 10/839,228

(22) Filed: May 6, 2004

(65) Prior Publication Data

US 2004/0223129 A1 Nov. 11, 2004

(30) Foreign Application Priority Data

May 7, 2003 (JP) ........................................ 2003-128916

(51) Int. Cl.[7] ............................ G03B 27/54; G03B 27/42
(52) U.S. Cl. ........................................ 355/67; 355/53
(58) Field of Search ....................... 355/53, 55, 67–71; 356/399–401; 250/548

(56) References Cited

U.S. PATENT DOCUMENTS 5,311,362 A * 5/1994 Matsumoto et al. ........ 359/738
5,900,926 A * 5/1999 Kato ............................ 355/53
6,251,550 B1   6/2001 Ishikawa
6,268,904 B1 * 7/2001 Mori et al. .................... 355/53

FOREIGN PATENT DOCUMENTS

| JP | 05-150175 | 6/1993 |
| JP | 09-197251 | 7/1997 |
| JP | 2001-305663 A | 11/2001 |
| WO | WO 02/12961 A1 | 2/2002 |

* cited by examiner

Primary Examiner—Henry Hung Nguyen
(74) Attorney, Agent, or Firm—Sughrue Mion, PLLC

(57) ABSTRACT

A spatial light modulator performs spatial light modulation of light produced by a light source. An image-side telecentric image forming optical system forms an image of a two-dimensional pattern of the light, which has been obtained from the spatial light modulation, on a photosensitive material. An axial air separation adjusting section is located between the image forming optical system and the photosensitive material. The axial air separation adjusting section alters an axial air separation between the image forming optical system and the photosensitive material and thereby adjusts a focusing point at the time of the formation of the image of the two-dimensional pattern of the light.

18 Claims, 16 Drawing Sheets

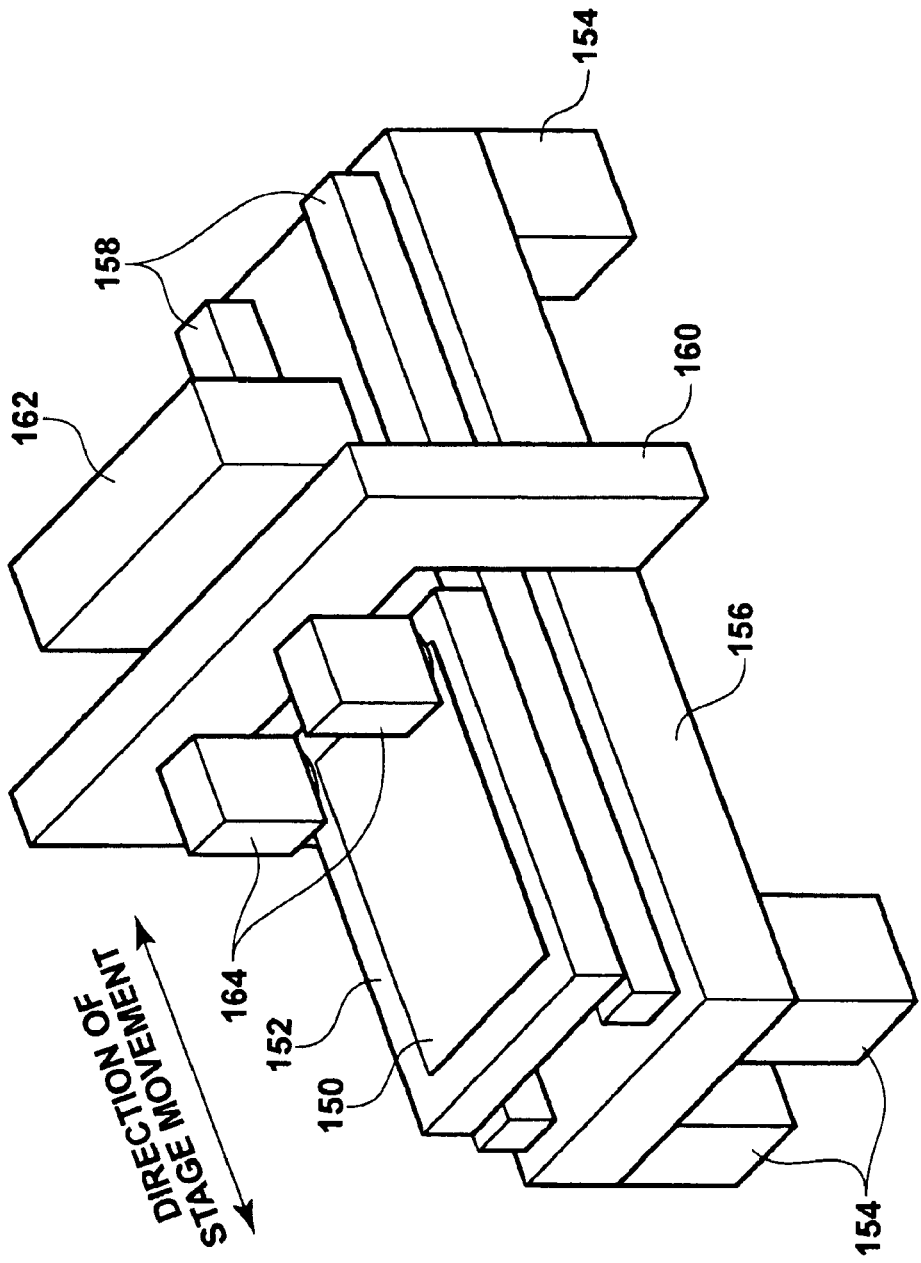

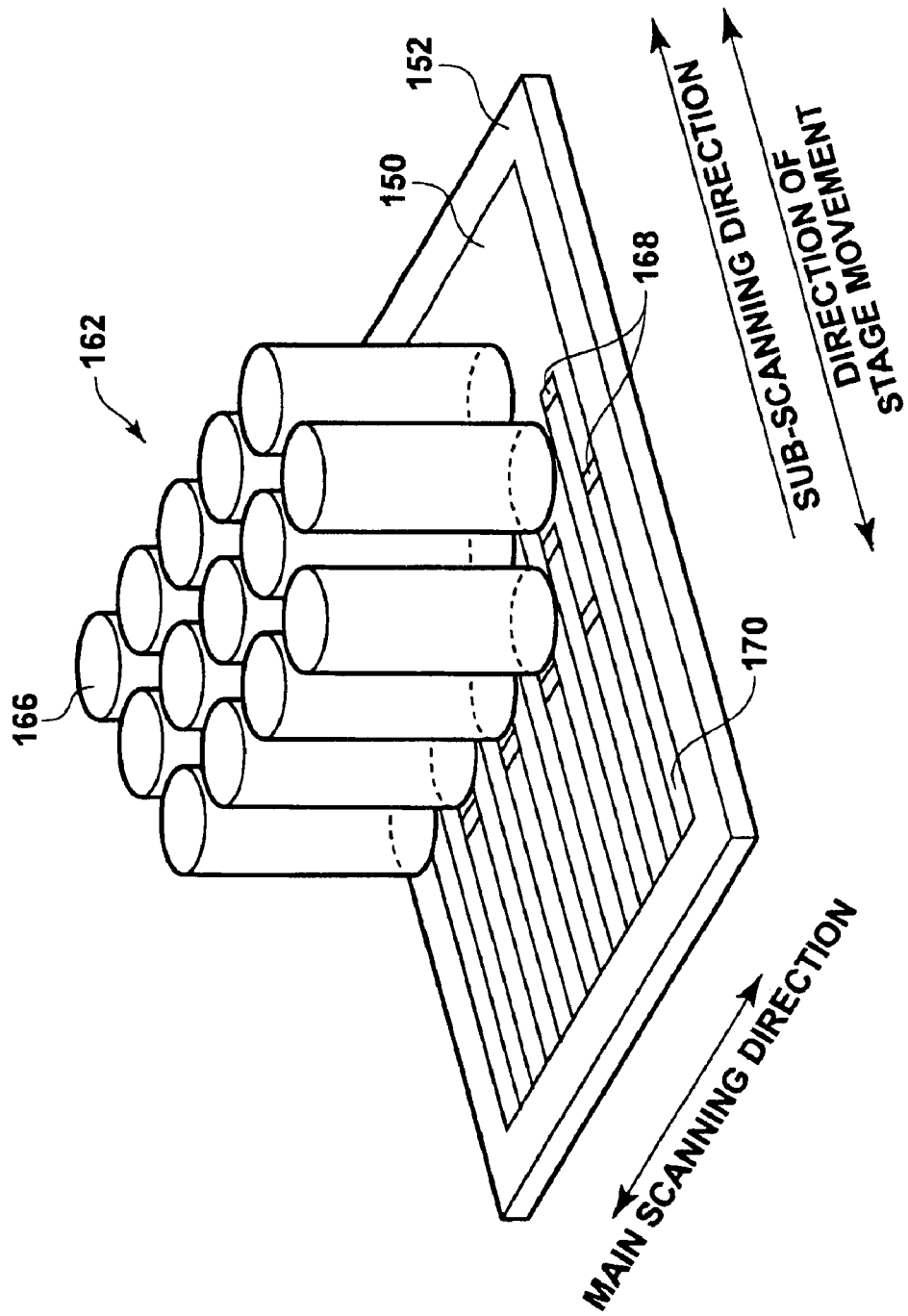

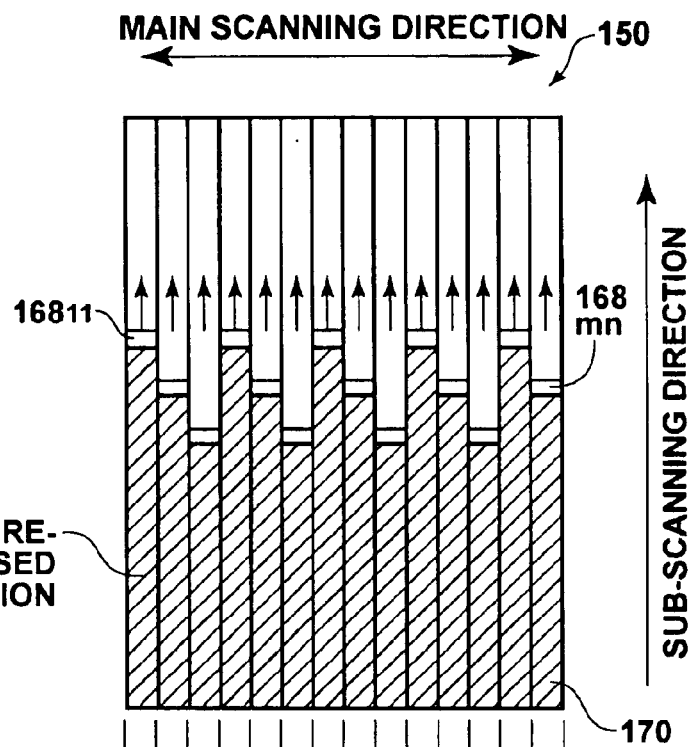
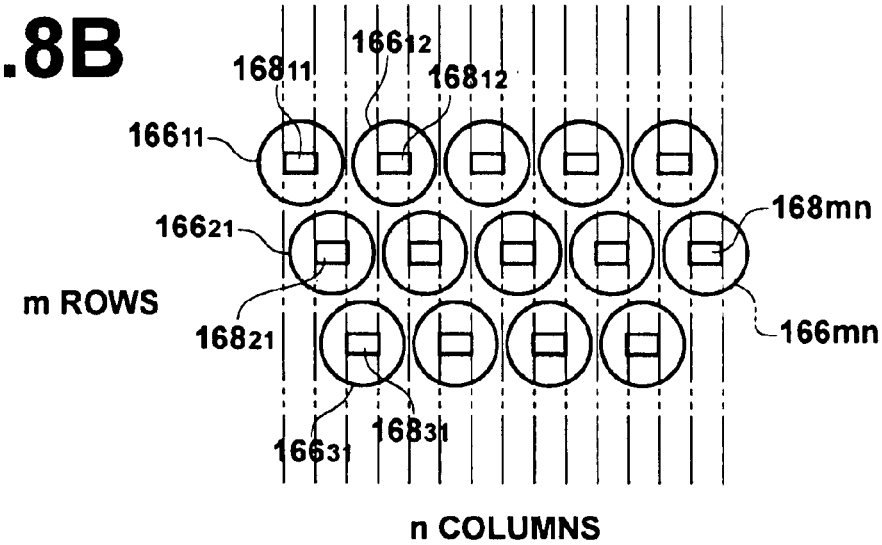

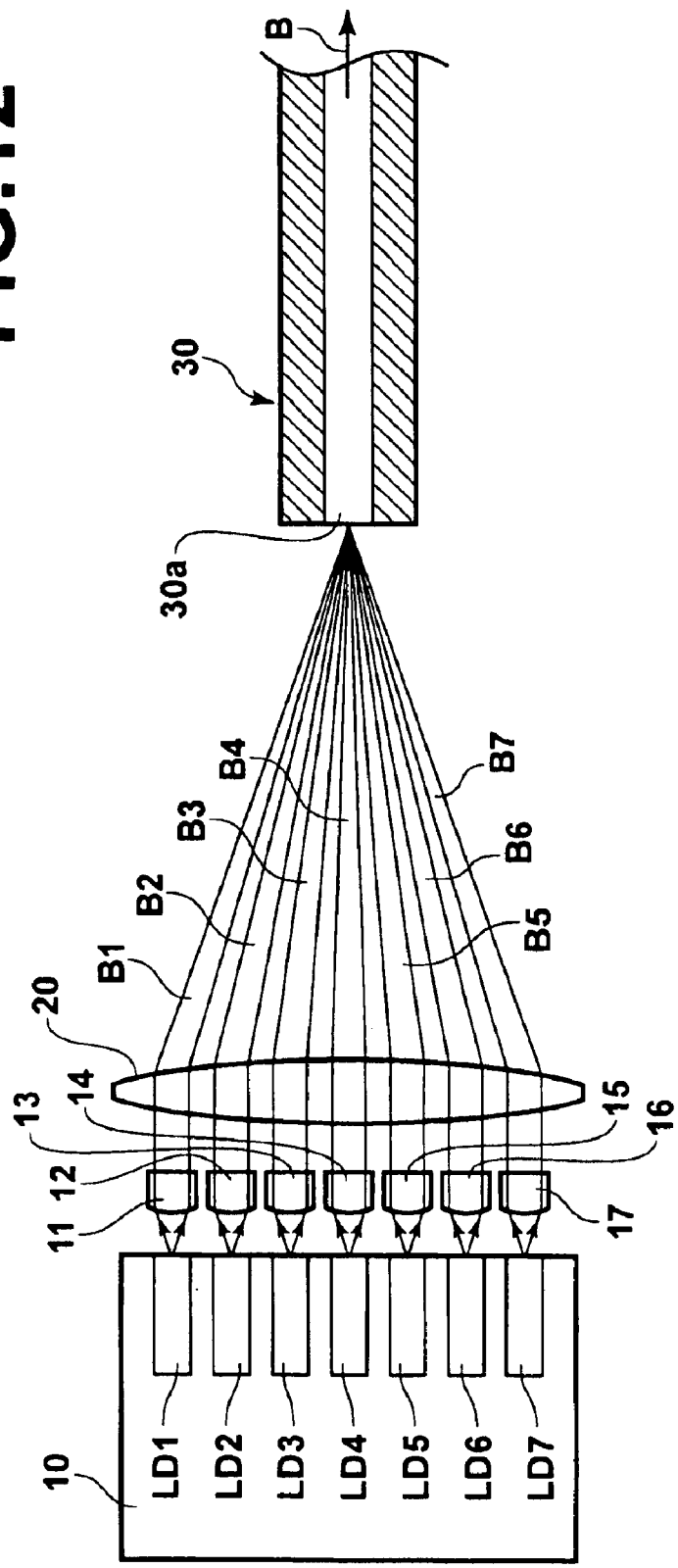

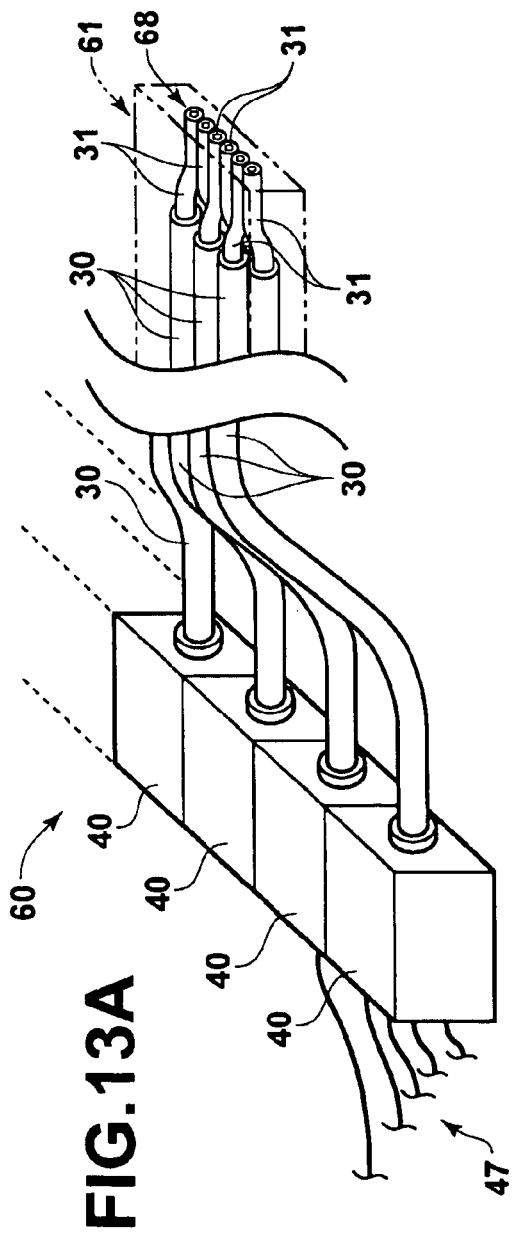
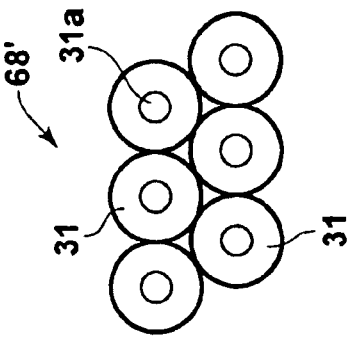
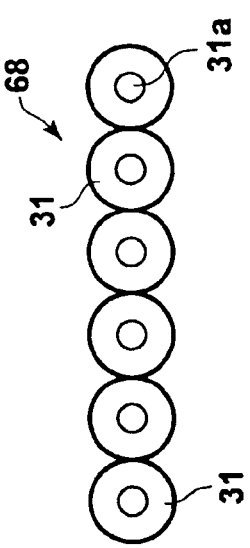
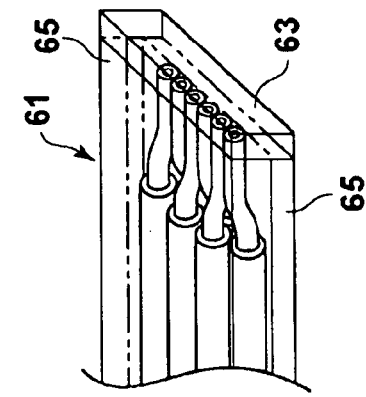

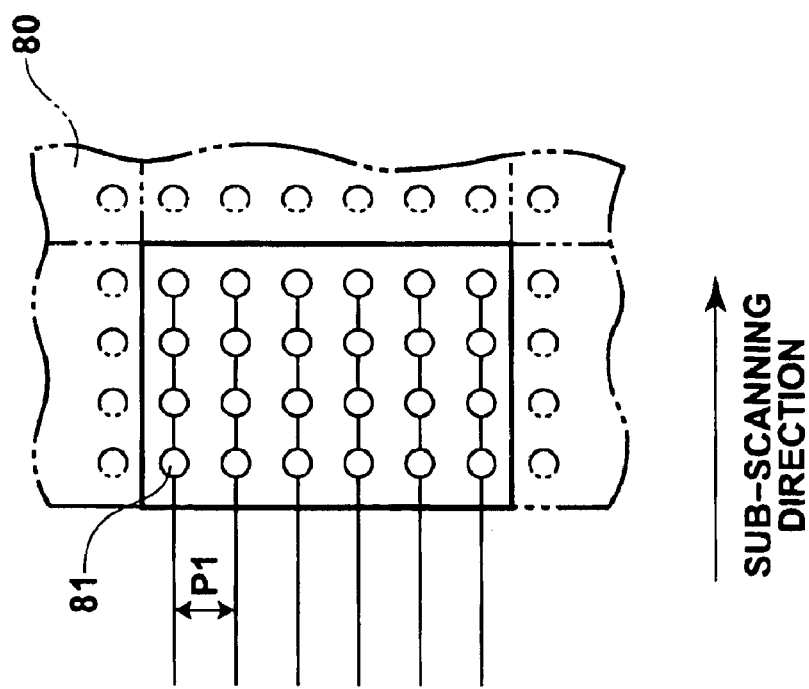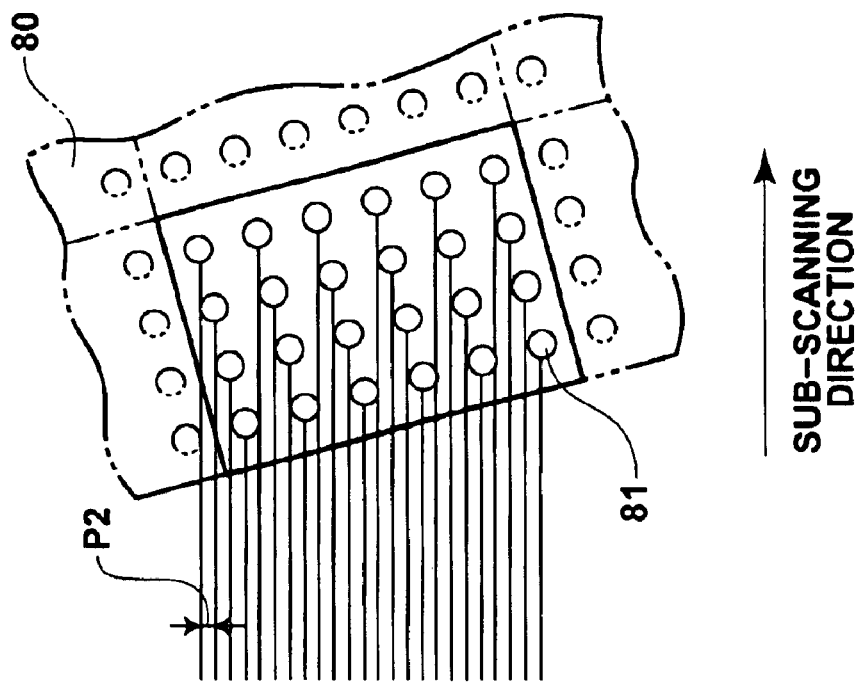

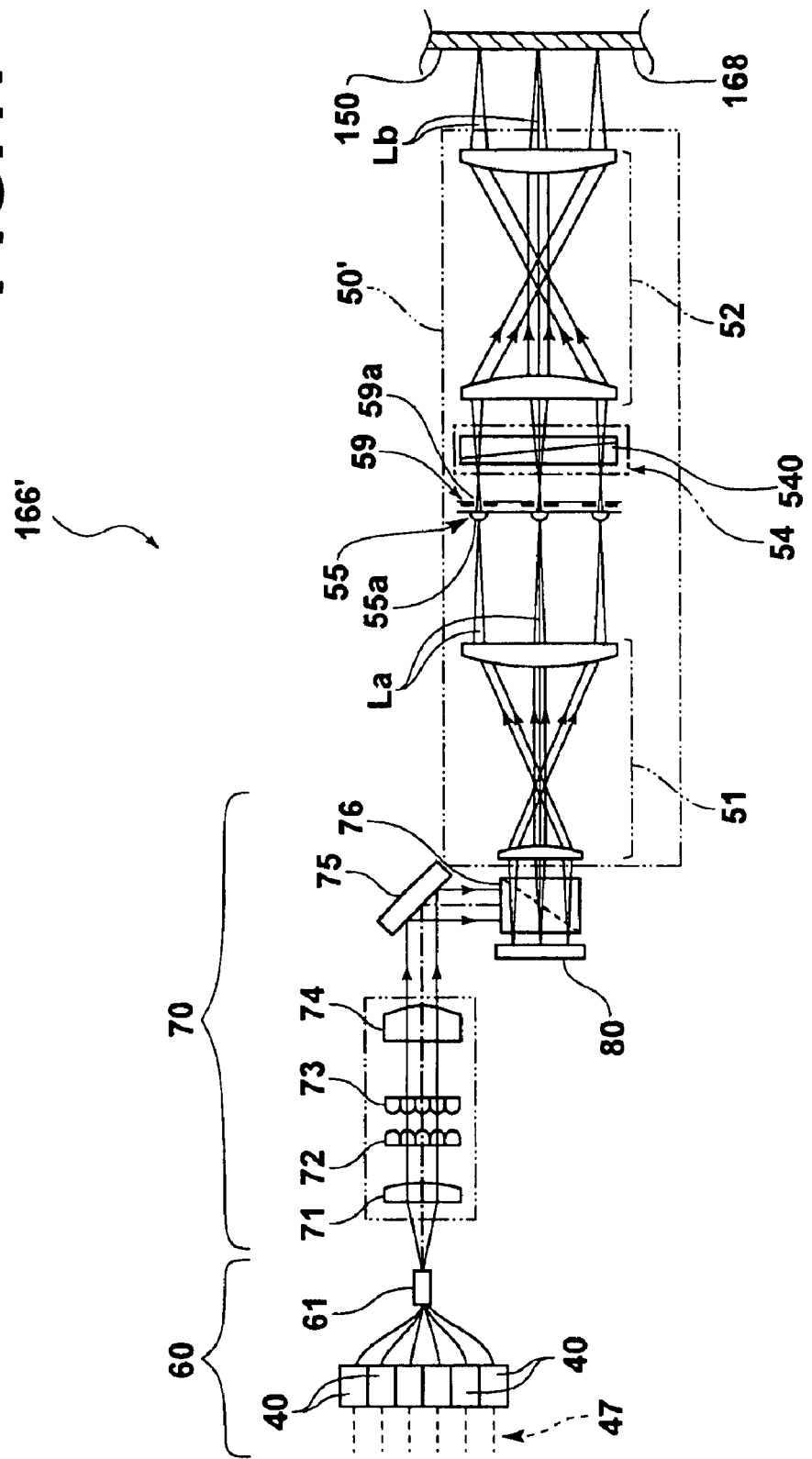

PROJECTING EXPOSURE APPARATUS

BACKGROUND OF THE INVENTION

1. Field of the Invention

This invention relates to a projecting exposure apparatus. This invention particularly relates to a projecting exposure apparatus, wherein an image of a two-dimensional pattern of light having been obtained from spatial light modulation is projected through an image side telecentric image forming optical system onto a photosensitive material, and the photosensitive material is thus exposed to the two-dimensional pattern of the light.

2. Description of the Related Art

Projecting exposure apparatuses, wherein spatial light modulation means for performing spatial light modulation of incident light is utilized, a two-dimensional pattern of the light, which has been obtained from the spatial light modulation performed by the spatial light modulation means, is projected onto a photosensitive material, and the photosensitive material is thus exposed to the two-dimensional pattern of the light, have heretofore been known. Also, projecting exposure apparatuses, wherein a digital micromirror device (hereinbelow referred to as the DMD) comprising a plurality of (e.g., 1,024×756) micromirrors, which allow alteration of their inclination angles and which are arrayed in a two-dimensional pattern, is utilized as the spatial light modulation means, have heretofore been known. (The projecting exposure apparatuses, wherein the digital micromirror device (DMD) is utilized as the spatial light modulation means, are described in, for example, Patent Literature 1.) As the digital micromirror device (DMD), for example, a DMD supplied by Texas Instruments Co. has been known. Projectors for dynamic images, wherein the DMD is utilized, and the like, have been used in practice.

The projecting exposure apparatuses utilizing the DMD are provided with an image forming lens for forming an image of each of the micromirrors of the DMD on the photosensitive material. With the projecting exposure apparatuses utilizing the DMD, the images of only the light, which has been reflected from certain micromirrors inclined at predetermined angles among the micromirrors that receive the irradiated light for exposure, and which travels toward the image forming lens, are formed through the image forming lens and on the photosensitive material. In this manner, the two-dimensional pattern having been obtained from the spatial light modulation performed by the DMD is projected onto the photosensitive material, and the photosensitive material is thus exposed to the two-dimensional pattern. Specifically, with the projecting exposure apparatuses utilizing the DMD, the exposure operation is performed such that each of pixels constituting the image of the two-dimensional pattern projected onto the photosensitive material corresponds to one of the micromirrors.

Also, attempts have heretofore been made to expose a photosensitive material, for example, a board on which a photoresist has been overlaid, to light carrying a circuit pattern by use of the projecting exposure apparatuses described above. Further, it has been considered to employ a technique, wherein an image forming optical system, which is telecentric on the image side, is utilized as the image forming optical system of the projecting exposure apparatuses, such that the image of the circuit pattern is capable of being formed on the board with accurate magnification, i.e. with quality free from variation in size of the image of the circuit pattern and distortion of the image.

[Patent Literature 1]
Japanese Unexamined Patent Publication No. 2001-305663

However, at the time of the exposure operation for the circuit pattern described above, it is necessary to perform an adjustment of a focusing point such that the position of the formation of the image of the circuit pattern performed by the image forming optical system and the position of the photoresist layer overlaid on the board may coincide with each other. It may be considered that the adjustment of the focusing point be performed with, for example, an adjustment of an axial air separation between the lenses constituting the image forming optical system. However, it is not always possible to alter the axial air separation between the lenses constituting the image forming optical system such that the size of the image of the circuit pattern may not vary and such that the image of the circuit pattern may not be distorted. Therefore, it is desired that the adjustment of the focusing point is capable of being performed with an adjustment of the separation between the image forming optical system and the board provided with the photoresist layer.

However, for example, in cases where the exposure operation is to be performed for a base plate for the formation of a liquid crystal display panel, a base plate for the formation of a plasma display panel, or the like, which base plate has a comparatively large size, the size of the image forming optical system, or the like, becomes large as the size of the base plate subjected to the exposure operation becomes large, and the problems occur in that it is not always possible to alter the separation between the image forming optical system and the base plate in order to perform the adjustment of the focusing point. Also, for example, in cases where subregions of the entire region of the base plate are to be subjected successively to the exposure operation, while the base plate is being conveyed, and the exposure operation is thus performed for the entire exposure region, it is required that a shift in focusing point, which shift occurs due to warpage of the shape of the base plate (e.g., the warpage of the shape of 100 $\mu$m), or the like, be compensated for quickly in each of steps of the conveyance of the base plate. Therefore, the problems occur in that it is not always possible to alter the separation between the image forming optical system and the base plate in order to perform the adjustment of the focusing point.

SUMMARY OF THE INVENTION

The primary object of the present invention is to provide a projecting exposure apparatus, wherein projection of a two-dimensional pattern of light, which has been obtained from spatial light modulation, is capable of being performed such that an adjustment of a focusing point is capable of being performed easily and quickly.

The present invention provides a first projecting exposure apparatus, comprising:

i) spatial light modulation means for performing spatial light modulation of light, which has been produced by a light source, and thereby forming a two-dimensional pattern of the light, and ii) an image-side telecentric image forming optical system for forming an image of the two-dimensional pattern of the light, which has been obtained from the spatial light modulation performed by the spatial light modulation means, on a photosensitive material, the two-dimensional pattern of the light being projected onto the photosensitive material, the photosensitive material being thus exposed to the two-dimensional pattern of the light, wherein the projecting exposure apparatus further comprises axial air separation adjusting means, which is located between the image forming optical system and the photosensitive material, and which alters an axial air separation between the image forming optical system and the photosensitive material and thereby adjusts a focusing point at the time of the formation of the image of the two-dimensional pattern of the light.

The present invention also provides a second projecting exposure apparatus, comprising:

i) spatial light modulation means provided with a plurality of pixel sections arrayed in two-dimensional directions, which pixel sections modulate incident light in accordance with a predetermined control signal, the spatial light modulation means performing spatial light modulation of the light with the plurality of the pixel sections, ii) a first image forming optical system for forming an image of a two-dimensional pattern of the light, which has been obtained from the spatial light modulation performed by the spatial light modulation means, iii) a microlens array located in the vicinity of a plane of image formation of the two-dimensional pattern, whose image is formed by the first image forming optical system, the microlens array being provided with a plurality of microlenses arrayed in two-dimensional directions, each of which microlenses transmits one of light beams corresponding respectively to the pixel sections of the spatial light modulation means and having passed through the first image forming optical system, and iv) a second image forming optical system, which is an image-side telecentric image forming optical system, the second image forming optical system forming an image of each of the light beams, which have passed through the microlens array, on a photosensitive material, the two-dimensional pattern of the light being projected onto the photosensitive material, the photosensitive material being thus exposed to the two-dimensional pattern of the light, wherein the projecting exposure apparatus further comprises axial air separation adjusting means, which is located between the second image forming optical system and the photosensitive material, and which alters an axial air separation between the second image forming optical system and the photosensitive material and there by adjusts a focusing point at the time of the formation of the image of the two-dimensional pattern of the light.

The present invention further provides a third projecting exposure apparatus, comprising:

i) spatial light modulation means provided with a plurality of pixel sections arrayed in two-dimensional directions, which pixel sections modulate incident light in accordance with a predetermined control signal, the spatial light modulation means performing spatial light modulation of the light with the plurality of the pixel sections, ii) a first image forming optical system for forming an image of a two-dimensional pattern of the light, which has been obtained from the spatial light modulation performed by the spatial light modulation means, iii) a microlens array located in the vicinity of a plane of image formation of the two-dimensional pattern, whose image is formed by the first image forming optical system, the microlens array being provided with a plurality of microlenses arrayed in two-dimensional directions, each of which microlenses transmits one of light beams corresponding respectively to the pixel sections of the spatial light modulation means and having passed through the first image forming optical system, and iv) a second image forming optical system, which is an image-side telecentric image forming optical system, the second image forming optical system forming an image of each of the light beams, which have passed through the microlens array, on a photosensitive material, the two-dimensional pattern of the light being projected onto the photosensitive material, the photosensitive material being thus exposed to the two-dimensional pattern of the light, wherein the projecting exposure apparatus further comprises axial air separation adjusting means, which is located between the microlens array and the second image forming optical system, and which alters an axial air separation between the microlens array and the second image forming optical system and thereby adjusts a focusing point at the time of the formation of the image of the two-dimensional pattern of the light.

Each of the first, second, and third projecting exposure apparatuses in accordance with the present invention may be modified such that the axial air separation adjusting means is provided with a wedge-shaped prism pair and adjusts the focusing point by moving a position of one of wedge-shaped prisms, which constitute the wedge-shaped prism pair, with respect to the position of the other wedge-shaped prism and in a direction, which is associated with a minimum width of each of regions of the formation of the image of the two-dimensional pattern on the photosensitive material.

Also, each of the first, second, and third projecting exposure apparatuses in accordance with the present invention may be modified such that the spatial light modulation means is a digital micromirror device.

Alternatively, the spatial light modulation means may be a mask comprising a glass plate, on which a two-dimensional pattern has been drawn, or the like.

Further, each of the first, second, and third projecting exposure apparatuses in accordance with the present invention may be modified such that the digital micromirror device performs the spatial light modulation by use of only a part of the plurality of the pixel sections, which constitute the digital micromirror device and are arrayed in the two-dimensional directions.

The term "image-side telecentric image forming optical system" as used herein means the image forming optical system, which forms optical paths that are telecentric on the image side.

The two-dimensional pattern of the light may represent an image to be displayed. Alternatively, the two-dimensional pattern of the light may represent an electric wiring circuit pattern, or the like.

By way of example, the wedge-shaped prism pair may be constituted of a pair of the wedge-shaped prisms obtained with a process wherein a transparent plane-parallel plate is cut along an oblique plane, which is inclined with respect to parallel planes of the transparent plane-parallel plate. In such cases, the wedge-shaped prism pair are capable of forming a plane-parallel plate with the combination of two wedge-shaped prisms. Therefore, the position of one of the two wedge-shaped prisms may be moved with respect to the other wedge-shaped prism and in one direction, and the thickness of the plane-parallel plate, which is formed with the combination of the one pair of the wedge-shaped prisms, is thus capable of being altered. With the alteration of the thickness of the plane-parallel plate, which is formed with the combination of the one pair of the wedge-shaped prisms, the axial air separation between the image forming optical system and the photosensitive material is capable of being altered.

The photosensitive material may be a board for the formation of a printed circuit board, which board is coated with a photoresist for forming a two-dimensional circuit pattern. Alternatively, the photosensitive material may be a base plate for the formation of a liquid crystal display panel or a plasma display panel, which base plate is coated with a photoresist for forming a two-dimensional circuit pattern.

As will be understood from the specification, it should be noted that the term "moving a position of one of wedge-shaped prisms with respect to the position of the other wedge-shaped prism" as used herein means movement of the position of the one wedge-shaped prism relative to the position of the other wedge-shaped prism, and embraces the cases wherein the position of the one wedge-shaped prism is moved while the other wedge-shaped prism is kept stationary, the cases wherein the position of the other wedge-shaped prism is moved while the one wedge-shaped prism is kept stationary, and the cases wherein both the position of the one wedge-shaped prism and the position of the other wedge-shaped prism are moved.

The first projecting exposure apparatus in accordance with the present invention is provided with the axial air separation adjusting means, which alters the axial air separation between the image forming optical system and the photosensitive material and thereby adjusts the focusing point at the time of the formation of the image of the two-dimensional pattern of the light. Therefore, with the first projecting exposure apparatus in accordance with the present invention, the adjustment of the focusing point by the alteration of the axial air separation between the image forming optical system and the photosensitive material is capable of being performed easily and quickly. Specifically, the axial air separation adjusting functions of the axial air separation adjusting means are capable of being separated from the image forming functions of the image forming optical system, the functions for supporting and conveying the photosensitive material, and the like. Therefore, the constitution for the adjustment of the axial air separation is capable of being kept simpler than with a conventional technique, and the adjustment of the focusing point at the time of the projection of the two-dimensional pattern of the light onto the photosensitive material is capable of being performed easily and quickly.

Each of the second and third projecting exposure apparatuses in accordance with the present invention comprises the first image forming optical system for forming the image of the two-dimensional pattern of the light, which has been obtained from the spatial light modulation performed by the spatial light modulation means, the microlens array located in the vicinity of the plane of image formation of the two-dimensional pattern, whose image is formed by the first image forming optical system, and the second image forming optical system, which is the image-side telecentric image forming optical system, the second image forming optical system forming the image of each of the light beams, which have passed through the microlens array, on the photosensitive material. Also, each of the second and third projecting exposure apparatuses in accordance with the present invention comprises the axial air separation adjusting means, which is located between the second image forming optical system and the photosensitive material, or which is located between the microlens array and the second image forming optical system. Therefore, with each of the second and third projecting exposure apparatuses in accordance with the present invention, the adjustment of the focusing point of each of the light beams, whose images are formed on the photosensitive material, is capable of being performed easily and quickly. Specifically, the axial air separation adjusting functions of the axial air separation adjusting means are capable of being separated from the image forming functions of the first image forming optical system, the image forming functions of the second image forming optical system, the functions for supporting and conveying the photosensitive material, and the like. Therefore, the constitution for the adjustment of the axial air separation is capable of being kept simpler than with a conventional technique, and the adjustment of the focusing point at the time of the projection of the two-dimensional pattern of the light onto the photosensitive material is capable of being performed easily and quickly.

Each of the first, second, and third projecting exposure apparatuses in accordance with the present invention may be modified such that the axial air separation adjusting means is provided with the wedge-shaped prism pair and adjusts the focusing point by moving the position of one of the wedge-shaped prisms, which constitute the wedge-shaped prism pair, with respect to the position of the other wedge-shaped prism and in the direction, which is associated with the minimum width of each of the regions of the formation of the image of the two-dimensional pattern on the photosensitive material. With the modification described above, the distance of the movement of the wedge-shaped prism at the time of the adjustment of the focusing point is capable of being kept short, and the constitution for the adjustment of the axial air separation is capable of being kept simple.

Also, each of the first, second, and third projecting exposure apparatuses in accordance with the present invention may be modified such that the spatial light modulation means is the digital micromirror device, the digital micromirror device performs the spatial light modulation by use of only a part of the plurality of the pixel sections, which constitute the digital micromirror device and are arrayed in the two-dimensional directions. With the modification described above, the distance of the movement of the wedge-shaped prism at the time of the adjustment of the focusing point is capable of being reduced even further, and the adjustment of the axial air separation is capable of being performed more quickly and more easily.

BRIEF DESCRIPTION OF THE DRAWINGS

FIG. 6 is a perspective view showing an appearance of the embodiment of the projecting exposure apparatus in accordance with the present invention, FIG. 7 is a perspective view showing how an exposure operation is performed by the projecting exposure apparatus of FIG. 6, FIG. 8A is a plan view showing exposure-processed regions, which are formed on a photosensitive material, FIG. 8B is an explanatory view showing an array of exposure processing areas, each of which is subjected to exposure processing performed by one of exposure heads, FIG. 12 is an enlarged plan view showing optical elements of the laser beam combining light source, FIG. 13A is a perspective view showing a light source unit, FIG. 13B is an enlarged view showing a part of a laser beam radiating section, FIG. 13C is a front view showing an example of an array of optical fibers at the laser beam radiating section, FIG. 13D is a front view showing a different example of an array of optical fibers at the laser beam radiating section, FIG. 15A is a plan view showing how the photosensitive material is exposed to light beams in cases where the DMD is located in an orientation, which is not oblique, FIG. 15B is a plan view showing how the photosensitive material is exposed to the light beams in cases where the DMD is located in an oblique orientation, FIG. 17 is a side view showing a different embodiment of the projecting exposure apparatus in accordance with the present invention, wherein an axial air separation adjusting section is located between a microlens array and a second image forming optical system, which is an image-side telecentric image forming optical system.

DESCRIPTION OF THE PREFERRED EMBODIMENTS

The present invention will hereinbelow be described in further detail with reference to the accompanying drawings.

Figure 1:
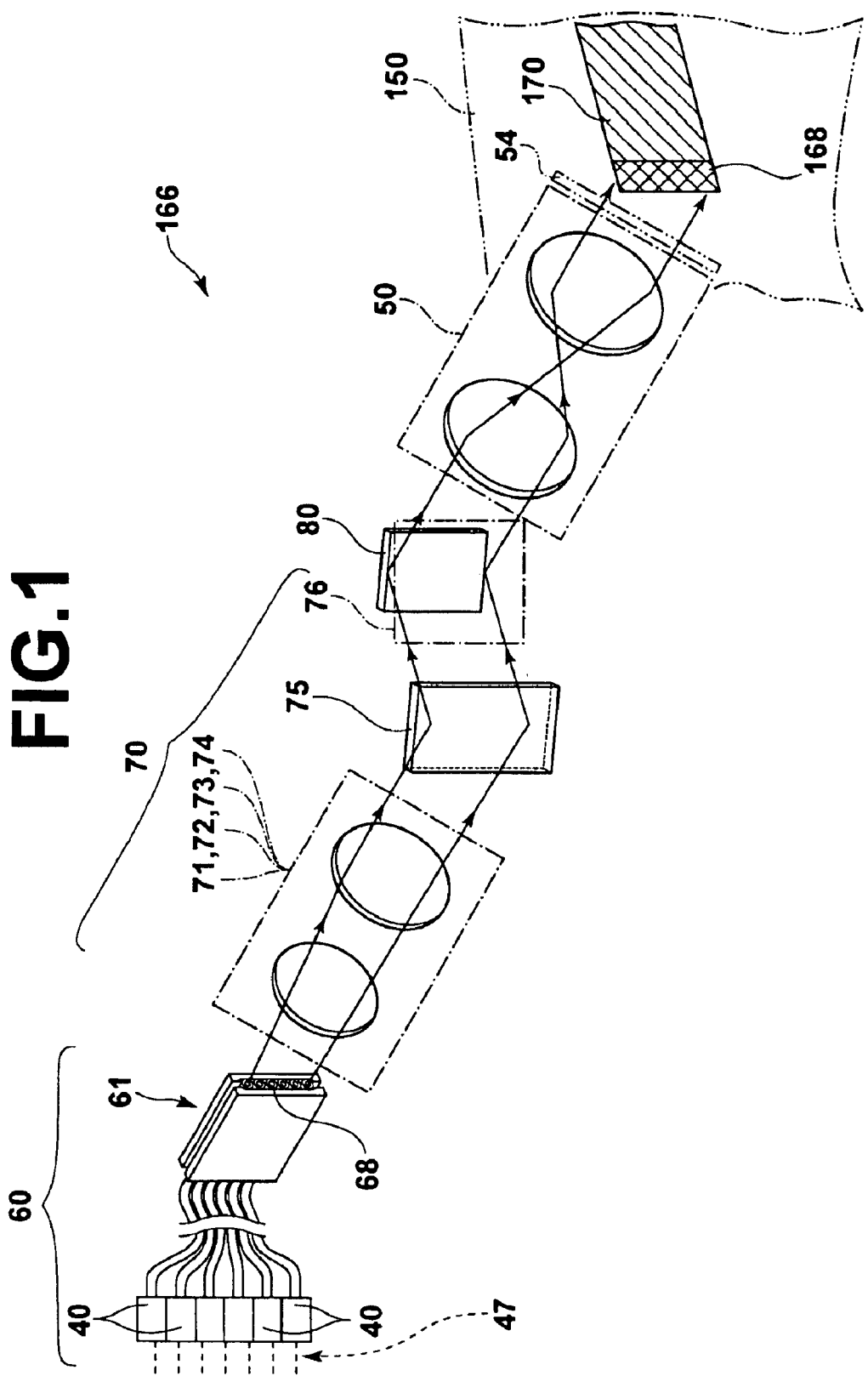
FIG. 1 is a developed conceptual view showing an exposure head in an embodiment of the projecting exposure apparatus in accordance with the present invention.
Figure 2:
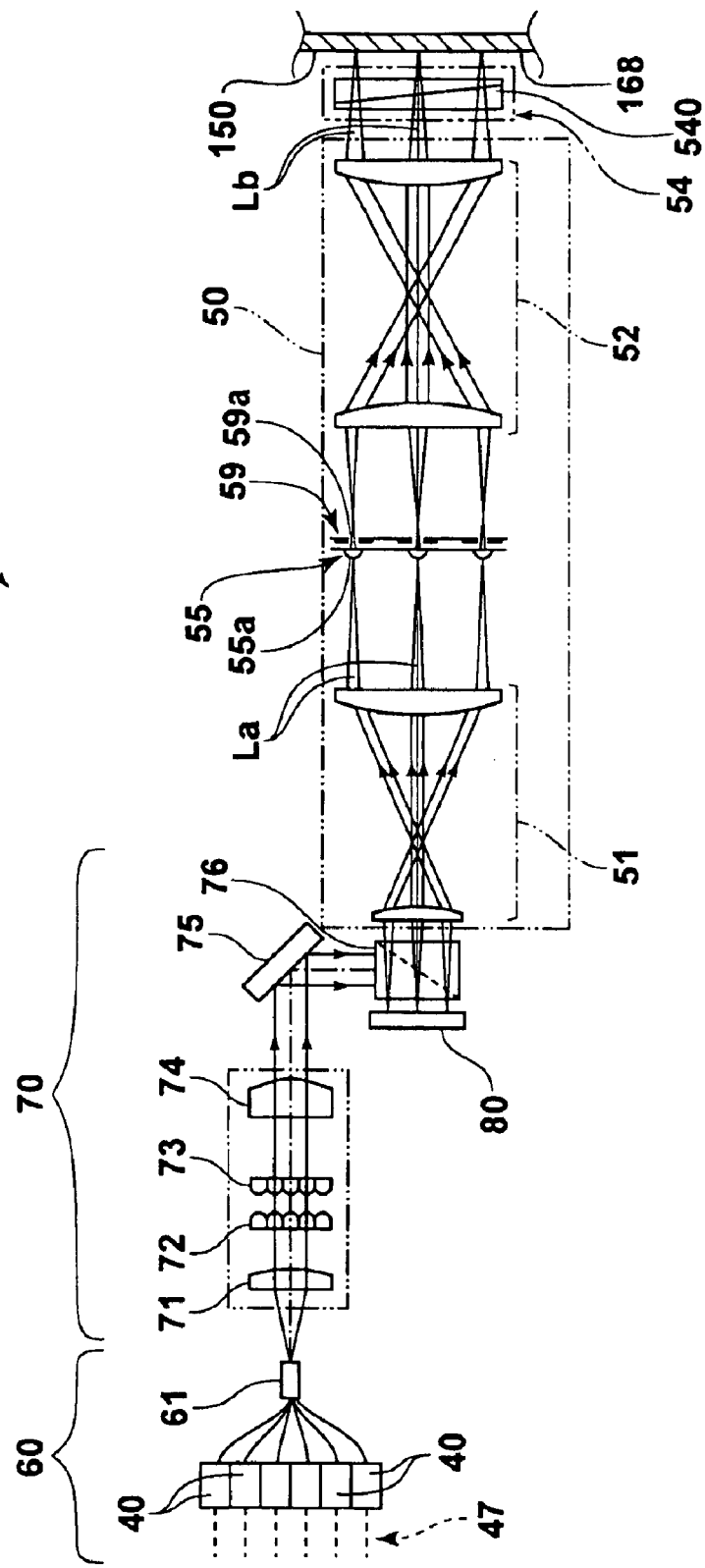
FIG. 2 is a side view showing a constitution of the exposure head along optical paths of light beams traveling through the exposure head.
Figure 3:
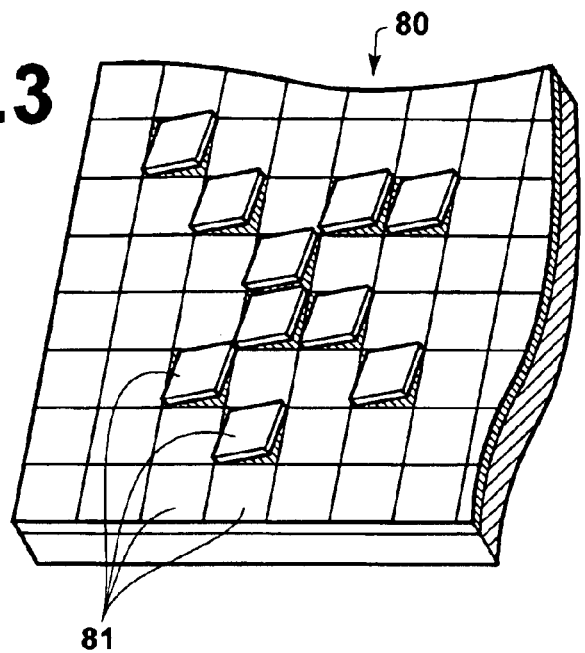
FIG. 3 is a perspective view showing a DMD.

FIG. 1 is a developed conceptual view showing an exposure head of an embodiment of the projecting exposure apparatus in accordance with the present invention. FIG. 2 is a side view showing a constitution of the exposure head along optical paths of light beams traveling through the exposure head. FIG. 3 is a perspective view showing a DMD.

The embodiment of the projecting exposure apparatus in accordance with the present invention comprises a DMD 80 constituted of a plurality of micromirrors 81, 81, . . . , which are arrayed in two-dimensional directions. Each of the micromirrors 81, 81, . . . acts as one of the pixel sections for modulating incident light, which has been produced by a light source unit 60 acting as the light source and has then passed through a DMD irradiation optical system 70, in accordance with a predetermined control signal. The DMD 80 acts as the spatial light modulation means for performing spatial light modulation of the light with the micromirrors 81, 81, . . . The projecting exposure apparatus also comprises an optical system 50 provided with a second image forming optical system 52, which is an image-side telecentric image forming optical system. The optical system 50 forms an image of a two-dimensional pattern of the light, which has been obtained from the spatial light modulation performed by the DMD 80, on a photosensitive material 150. The projecting exposure apparatus further comprises an axial air separation adjusting section 54, which is located between the second image forming optical system 52 of the optical system 50 and the photosensitive material 150. The axial air separation adjusting section 54 is provided with a wedge-shaped prism pair 540 for altering an axial air separation between the second image forming optical system 52 and the photosensitive material 150 and thereby adjusting a focusing point at the time of the formation of the image of the two-dimensional pattern of the light. With the projecting exposure apparatus, the two-dimensional pattern of the light is projected onto the photosensitive material 150, and the photosensitive material 150 is thus exposed to the two-dimensional pattern of the light.

The light source unit 60, the DMD irradiation optical system 70, the DMD 80, the optical system 50 provided with the second image forming optical system 52, the axial air separation adjusting section 54, and the like, are optical elements constituting an exposure head 166, which will be described later. By way of example, the two-dimensional pattern may represent a circuit pattern. The exposure surface of the photosensitive material 150 may have a size of, for example, 500 mm×600 mm. The photosensitive material 150 may be a board for the formation of a printed circuit board, which board is coated with a photoresist for forming a two-dimensional circuit pattern. Alternatively, the photosensitive material 150 may be a base plate for the formation of a liquid crystal display panel or a plasma display panel, which base plate is coated with a photoresist for forming a two-dimensional circuit pattern.

The optical system 50 provided with the second image forming optical system 52, which is the image-side telecentric image forming optical system, and the like, will be described hereinbelow.

Optical System 50

As illustrated in FIG. 2, an optical system 50, which is one of the optical elements constituting the exposure head 166, comprises a first image forming optical system 51 for forming an image of the two-dimensional pattern of the light, which has been obtained from the spatial light modulation. The optical system 50 also comprises the second image forming optical system 52, which is the image-side telecentric image forming optical system. The second image forming optical system 52 relays the image of the two-dimensional pattern, which image has been formed by the first image forming optical system 51, and forms the image of the two-dimensional pattern on the photosensitive material 150. The optical system 50 further comprises a microlens array 55, an aperture array 59, and the like, which are located between the first image forming optical system 51 and the second image forming optical system 52.

The microlens array 55 is constituted of a plurality of microlenses 55a, 55a, . . . , which are arrayed in two-dimensional directions. Each of the microlenses 55a, 55a, . . . is located at a position corresponding to one of the micromirrors 81, 81, . . . of the DMD 80 (illustrated in FIG. 3), such that the microlens 55a transmits the light beam having been reflected from the corresponding micromirror 81 of the DMD 80 and having then passed through the first image forming optical system 51.

Also, the aperture array 59 comprises a plurality of apertures 59a, 59a, .... Each of the apertures 59a, 59a, ... is located at a position corresponding to one of the microlenses 55a, 55a, ... of the microlens array 55, such that the aperture 59a allows the passage of the light beam, which has passed through the corresponding microlens 55a of the microlens array 55.

In the optical system 50 having the constitution described above, the image of the micromirrors 81, 81, ..., which image is formed with the light beams having been reflected from the micromirrors 81, 81, ... of the DMD 80, is enlarged by the first image forming optical system 51 to a size three times as large as the size of the original image. Each of light beams La, La, ... corresponding respectively to the micromirrors 81, 81, ..., which light beam has passed through the first image forming optical system 51 after being reflected from the corresponding micromirror 81, is collected by the corresponding microlens 55a of the microlens array 55, which is located in the vicinity of the position of image formation with the first image forming optical system 51. Each of the light beams La, La, ..., which light beam has thus been collected by the corresponding microlens 55a, passes through the corresponding aperture 59a. The size of the image of the micromirrors 81, 81, ..., which image has been formed through the microlens array 55 and the aperture array 59, is enlarged even further by the second image forming optical system 52 by a factor of 1.67. The image of the micromirrors 81, 81, ..., which image has the thus enlarged size, passes through the wedge-shaped prism pair 540 of the axial air separation adjusting section 54 and is formed on the photosensitive material 150. As a result, the image of the micromirrors 81, 81, ... of the DMD 80 is ultimately enlarged by a factor of 5 (=3×1.67) and projected onto the photosensitive material 150.

Specifically, the light beams La, La, ... corresponding respectively to the micromirrors 81, 81, ... become image-side telecentric light beams Lb, Lb, ... after passing through the second image forming optical system 52. By the adjustment of the axial air separation performed with the axial air separation adjusting section 54, each of the light beams Lb, Lb, ... is adjusted such that the focusing point accurately coincides with the position on the photosensitive material 150. The light beams Lb, Lb, ... are thus projected onto the photosensitive material 150.

In cases where each of pixels constituting the image of the two-dimensional pattern, i.e. each of the light beams La, La, ..., which have passed through the first image forming optical system 51 and the corresponding microlenses 55a, 55a, ... after being reflected from the corresponding micromirrors 81, 81, ..., undergoes thickening due to aberrations of the optical elements described above, and the like, the light beam La is capable of being shaped by the corresponding aperture 59a such that the spot size of the light beam La, which corresponds to one of the micromirrors 81, 81, ... and the image of which is formed by the first image forming optical system 51, becomes identical with a predetermined size. Also, as described above, each of the light beams La, La, ..., which light beam has been reflected from one of the micromirrors 81, 81, ... is passed through the aperture 59a, which corresponds to the micromirror 81. Therefore, cross talk between the micromirrors 81, 81, ... (the pixels) is capable of being prevented from occurring, and the extinction ratio in on-off operations of each of the micromirrors 81, 81, ... at the time of the exposure operation is capable of being enhanced.

The state, in which each of the micromirrors 81, 81, ... is inclined at the predetermined angle such that the light beam having been reflected from the micromirror 81 travels toward the first image forming optical system 51 of the optical system 50, is the on state of the micromirror 81. Also, the state, in which each of the micromirrors 81, 81, ... is inclined at an angle different from the predetermined angle such that the light beam having been reflected from the micromirror 81 travels along a direction shifted from the direction of the optical path heading toward the first image forming optical system 51 of the optical system 50, is the off state of the micromirror 81. The image of the light beam, which has been reflected from the micromirror 81 in the on state, is formed on the photosensitive material 150, and the photosensitive material 150 is thus exposed to the light beam. Specifically, each of the micromirrors 81, 81, ... modulates the incident light in accordance with the alteration of the angle of inclination of the micromirror 81. Also, the DMD 80 alters the angle of inclination of each of the micromirrors 81, 81, ... in accordance with a predetermined control signal and thereby performs the spatial light modulation of the incident light.

Figure 4:
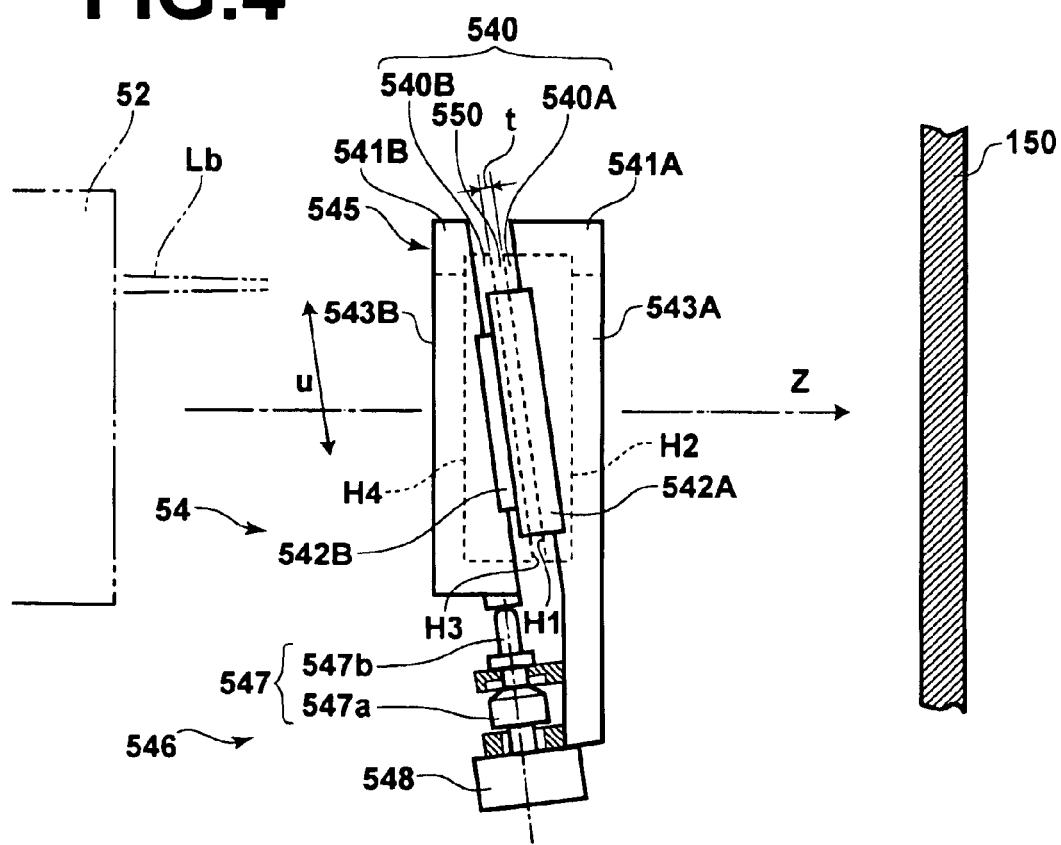
FIG. 4 is a side view showing an axial air separation adjusting section.
Figure 5:
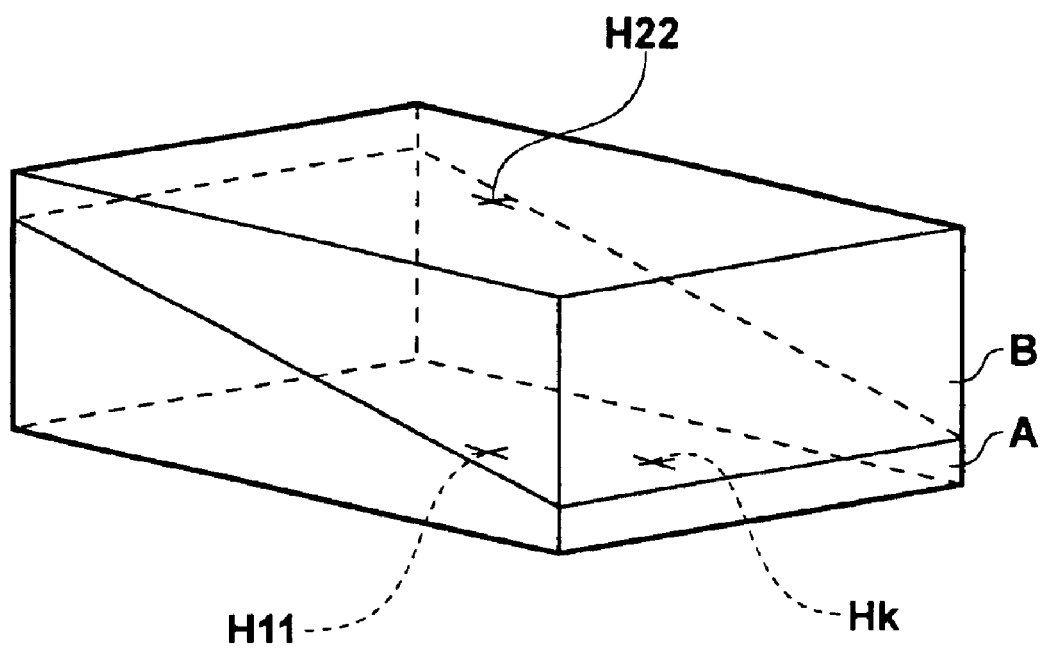
FIG. 5 is a perspective view showing a wedge-shaped prism pair.

The axial air separation adjusting section 54 will hereinbelow be described in detail with reference to FIG. 4 and FIG. 5. FIG. 4 is a side view showing an axial air separation adjusting section. FIG. 5 is a perspective view showing a wedge-shaped prism pair.

Axial Air Separation Adjusting Section 54

The axial air separation adjusting section 54 comprises a wedge-shaped prism 540A and a wedge-shaped prism 540B, which constitute the wedge-shaped prism pair 540. The axial air separation adjusting section 54 also comprises a base prism holder 541A for supporting the wedge-shaped prism 540A. The axial air separation adjusting section 54 further comprises slide bases 542A, 542A, which are located on opposite sides of the base prism holder 541A such that the wedge-shaped prism 540A supported by the base prism holder 541A intervenes between the slide bases 542A, 542A. The axial air separation adjusting section 54 still further comprises a sliding section 545, which is provided with the wedge-shaped prism 540B, a prism holder 541B for supporting the wedge-shaped prism 540B, and sliders 542B, 542B. The sliders 542B, 542B are located on opposite sides of the prism holder 541B such that the wedge-shaped prism 540B supported by the prism holder 541B intervenes between the sliders 542B, 542B. The sliders 542B, 542B are capable of moving on the slide bases 542A, 542A. The axial air separation adjusting section 54 also comprises an actuating section 546, which is secured to the base prism holder 541A in order to move the sliding section 545.

By way of example, the wedge-shaped prism 540A and the wedge-shaped prism 540B constituting the wedge-shaped prism pair 540 may be formed in the manner described below. Specifically, as illustrated in FIG. 5, a plane-parallel plate made from a transparent material, such as glass or an acrylic resin, may be cut along an oblique plane Hk, which is inclined with respect to parallel planes H11 and H22 of the plane-parallel plate, and a pair of wedge-shaped prisms A and B may thus be formed. The pair of the thus formed wedge-shaped prisms A and B may be utilized as the pair of the wedge-shaped prisms described above. In this embodiment, each of the wedge-shaped prism 540A and the wedge-shaped prism 540B is made from glass having a refractive index of 1.51.

The wedge-shaped prism 540A and the wedge-shaped prism 540B are supported respectively by the base prism holder 541A and the prism holder 541B, such that a plane-parallel plate may be formed by the combination of the wedge-shaped prism 540A and the wedge-shaped prism 540B with an air layer 550 of a thickness "t" (e.g., 10 μm) intervening between the wedge-shaped prism 540A and the wedge-shaped prism 540B. Also, a linear slide is constituted by the combination of the slide bases 542A, 542A and the sliders 542B, 542B. The actuating section 546 moves the sliding section 545 in one direction (i.e., the direction indicated by the double headed arrow U in FIG. 4), and the wedge-shaped prism 540B is thus moved with respect to the wedge-shaped prism 540A such that the thickness "t" of the air layer 550 intervening between the wedge-shaped prism 540A and the wedge-shaped prism 540B may not vary. With the movement of the sliding section 545, the substantial thickness of the plane-parallel plate, which is formed by the combination of the pair of the wedge-shaped prism 540A and the wedge-shaped prism 540B, (i.e., the thickness obtained by subtracting the thickness "t" of the air layer 550 from the thickness of the plane-parallel plate formed in the manner described above) is altered. With the alteration of the substantial thickness of the plane-parallel plate, which is formed by the combination of the pair of the wedge-shaped prism 540A and the wedge-shaped prism 540B, the adjustment of the axial air separation between the second image forming optical system 52 and the photosensitive material 150 is performed. The value obtained from the multiplication of the substantial thickness of the plane-parallel plate, which is formed by the combination of the pair of the wedge-shaped prism 540A and the wedge-shaped prism 540B, by the refractive index of the plane-parallel plate represents the axial air separation represented by the plane-parallel plate, i.e. the value resulting from the conversion of the thickness of the plane-parallel plate into the air thickness.

The angle of a plane H2 of the wedge-shaped prism 540A, which plane constitutes one of the parallel planes of the plane-parallel plate described above, with respect to an oblique surface H1 of the wedge-shaped prism 540A is equal to 5 degrees. Also, the angle of a plane H4 of the wedge-shaped prism 540B, which plane constitutes the other parallel plane of the plane-parallel plate described above, with respect to an oblique surface H3 of the wedge-shaped prism 540B is equal to 5 degrees. The distance of movement of the sliding section 545 actuated by the actuating section 546 is equal to 10 mm. In cases where the sliding section 545 is moved by the distance of 10 mm, the thickness of the plane-parallel plate, which is formed by the combination of the pair of the wedge-shaped prism 540A and the wedge-shaped prism 540B, alters by 870 μm. Therefore, with the alteration of the thickness of the plane-parallel plate by 870 μm, a quantity of alteration of the focus position (i.e., the quantity of the adjustment of the focusing point at the time of the formation of the image of the two-dimensional pattern of the light described above) becomes equal to 294 μm. Specifically, an alteration quantity δ of the focus position described above may be calculated with the formula shown below.

$$\delta = \epsilon((n-1)/n)$$

wherein ε represents the alteration quantity of the thickness of the plane-parallel plate, which is formed by the combination of the pair of the wedge-shaped prism 540A and the wedge-shaped prism 540B, and n represents the refractive index of the plane-parallel plate.

In this case, since the alteration quantity ε of the thickness of the plane-parallel plate, which is formed by the combination of the pair of the wedge-shaped prism 540A and the wedge-shaped prism 540B, is equal to 870 μm, and the refractive index "n" of the plane-parallel plate is equal to 1.51, the alteration quantity δ of the focus position described above may be calculated as δ=294 μm.

The base prism holder 541A and the prism holder 541B are respectively provided with an aperture 543A and aperture 543B. The aperture 543A and aperture 543B allow the passage of the light, which has been radiated out from the second image forming optical system 52, through the pair of the wedge-shaped prism 540A and the wedge-shaped prism 540B toward the photosensitive material 150.

In the actuating section 546, a thimble 547a of a micrometer head 547 is rotated by a stepping motor 548, and a spindle 547b of the micrometer head 547 is thus moved forward and backward. The sliding section 545 is moved in this manner.

The axial air separation adjusting section 54 is located such that the plane H2 and the plane H4, which constitute the parallel planes of the plane-parallel plate formed by the combination of the pair of the wedge-shaped prism 540A and the wedge-shaped prism 540B may extend in the direction, which is normal to the direction of the optical axis of the second image forming optical system 52 (i.e., the direction indicated by the arrow Z in FIG. 4), and such that the direction of the movement of the sliding section 545 may coincide with the direction, which is associated with the minimum width of each of the regions of the formation of the image of the two-dimensional pattern on the photosensitive material 150, (i.e., the sub-scanning direction in FIG. 8A, which will be described later). Specifically, the axial air separation adjusting section 54 is located such that the direction of the component of the movement of the sliding section 545 along the direction, which is normal to the optical axis direction (i.e., the Z direction), and the direction associated with the minimum width of each of the regions of the formation of the image of the two-dimensional pattern, which image is formed through the image-side telecentric image forming optical system described above and on the photosensitive material 150, (i.e., the direction in which the width of each of the regions of the formation of the image of the two-dimensional pattern becomes minimum in the direction normal to the Z direction described above) may coincide with each other.

The wedge-shaped prism pair 540 are provided with coating layers, such that the transmittance with respect to the light to which the photosensitive material 150 is exposed, i.e. blue light produced by the light source unit 60 as will be described later, may be at least 99.5%, and such that the reflectivity of each of the oblique surface H1 of the wedge-shaped prism 540A and the oblique surface H3 of the wedge-shaped prism 540B, which wedge-shaped prisms are adjacent to each other with the air layer 550 intervening therebetween, with respect to red light having wavelengths different from the wavelengths of the blue light described above may be at least 3%. Therefore, the parallelism between the oblique surface H1 and the oblique surface H3 and an alteration of the separation between the oblique surface H1 and the oblique surface H3 are capable of being measured with a process, wherein the state of interference of the coherent red light, which has been reflected from the oblique surface H1, and the coherent red light, which has been reflected from the oblique surface H3, is measured. Accordingly, a correction is capable of being made with respect to an error in movement of the sliding section 545, such that alterations of components of the light beams Lb, Lb, . . . , which have passed through the wedge-shaped prism pair 540, toward the direction normal to the optical axis direction (i.e., the Z direction) at the time of the travel of the light beams Lb, Lb, . . . toward the photosensitive material 150 may be suppressed.

In cases where microlenses having a short focal length (e.g., a focal length of 190 µm) are utilized as the microlenses 55a, 55a, . . . of the microlens array 55, even if the aberrations of the first image forming optical system 51 are comparatively large, variations in waist positions (focusing points) of the light beams having passed through the microlens array 55 will be capable of being suppressed. Therefore, in cases where the microlens array 55, the second image forming optical system 52, which is the image-side telecentric image forming optical system, and the axial air separation adjusting section 54 are combined with one another, the adjustment of the focusing point is capable of being performed more quickly and more easily.

The embodiment of the projecting exposure apparatus in accordance with the present invention, which comprises the exposure head 166 provided with the optical system 50, the axial air separation adjusting section 54, and the like, will hereinbelow be described in detail.

Explanation of Entire Constitution of the Projecting Exposure apparatus

FIG. 6 is a perspective view showing an appearance of the embodiment of the projecting exposure apparatus in accordance with the present invention. FIG. 7 is a perspective view showing how an exposure operation is performed by the projecting exposure apparatus of FIG. 6. FIG. 8A is a plan view showing exposure-processed regions, which are formed on a photosensitive material. FIG. 8B is an explanatory view showing an array of exposure processing areas, each of which is subjected to exposure processing performed by one of exposure heads.

As illustrated in FIG. 6, the embodiment of the projecting exposure apparatus in accordance with the present invention comprises a scanner unit 162 and a main body section for supporting the scanner unit 162. The main body section is provided with a flat plate-like stage 152 for supporting the photosensitive material 150 on the surface by suction. The main body section is also provided with a support base 156 and two guides 158, 158 secured to the surface of the support base 156. The guides 158, 158 extend in a sub-scanning direction and support the stage 152 such that the stage 152 is capable of moving in the sub-scanning direction. The stage 152 is supported by the guides 158, 158 such that the stage 152 is capable of reciprocally moving in the sub-scanning direction. The stage 152 is located such that the longitudinal direction of the stage 152 coincides with the sub-scanning direction. The projecting exposure apparatus is provided with an actuating section (not shown) for moving the stage 152 along the guides 158, 158.

A scanner support section 160 having a portal shape is located at a middle part of the support base 156. The scanner support section 160 extends over the movement path of the stage 152 and supports the scanner unit 162. The scanner support section 160 supports the scanner unit 162 on one side of the scanner support section 160, which side is taken with respect to the sub-scanning direction. The scanner support section 160 is provided with two detection sensors 164, 164 on the other side of the scanner support section 160, which side is taken with respect to the sub-scanning direction. The detection sensors 164, 164 detect a leading end and a tail end of the photosensitive material 150. The scanner unit 162 and the detection sensors 164, 164 are thus secured to the opposite sides of the scanner support section 160 and are located above the movement path of the stage 152. The scanner unit 162 and the detection sensors 164, 164 are connected to a controller (not shown) for controlling the scanner unit 162 and the detection sensors 164, 164. In FIG. 6, the reference numerals 154, 154, . . . represent pillars.

As illustrated in FIG. 7 and FIGS. 8A, 8B, the scanner unit 162 is provided with a plurality of (e.g., 14) exposure heads 166, 166, . . . for irradiating the exposure light to the photosensitive material 150. The exposure heads 166, 166, . . . are arrayed approximately in a matrix-like pattern composed of "m" number of rows and "n" number of columns (e.g., three rows and five columns).

In this embodiment, in accordance with the width of the photosensitive material 150, five exposure heads 166, 166, . . . are located along each of the first and second rows, and four exposure heads 166, 166, . . . are located along the third row. In cases where a certain exposure head 166 in the array of the exposure heads 166, 166, . . . , which exposure head is located at a position of an m'th row and an n'th column in the array of the exposure heads 166, 166, . . . , is to be represented, the certain exposure head 166 is herein represented as an exposure head 166$_{mn}$.

As illustrated in FIG. 8B, an exposure processing area 168$_{mn}$ corresponding to each exposure head 166$_{mn}$, which exposure processing area is subjected to the exposure processing performed by the exposure head 166$_{mn}$, has a rectangular shape, whose short side extends along the sub-scanning direction, i.e. the rectangular shape, in which the direction of the minimum width coincides with the sub-scanning direction. As illustrated in FIG. 8A, as the stage 152 moves along the sub-scanning direction, a band-shaped exposure-processed region 170$_{mn}$ corresponding to each exposure head 166$_{mn}$ is formed on the photosensitive material 150.

As illustrated in FIG. 8B, in the array of the exposure heads 166, 166, . . . of the scanner unit 162, a row of the exposure heads 166, 166, . . . and an adjacent row of the exposure heads 166, 166, . . . are shifted by a predetermined distance from each other with respect to a main scanning direction, which is normal to the sub-scanning direction described above. Such that the band-shaped exposure-processed regions 170, 170, . . . may be formed on the photosensitive material 150 without any unprocessed space being left between the band-shaped exposure-processed regions 170, 170, . . . in the main scanning direction, the areas, which are located between, for example, an exposure processing area 168$_{11}$ and an exposure processing area 168$_{12}$ corresponding respectively to an exposure head 166$_{11}$ and an exposure head 166$_{12}$ located along the first row, and which are not capable of being subjected to the exposure processing performed by the exposure head 166$_{11}$ and the exposure head 166$_{12}$, are exposure-processed with an exposure head 166$_{21}$, which is located along the second row and corresponds to an exposure processing area 168$_{21}$, and an exposure head 166$_{31}$, which is located along the third row and corresponds to an exposure processing area 168$_{31}$.

Each of the exposure heads 166, 166, . . . is constituted of the light source unit 60 described above, the DMD 80 described above, the optical system 50 described above, and a DMD irradiation optical system 70, which receives the light for exposure from the light source unit 60 and irradiates the light to the DMD 80. The light having been obtained from the spatial light modulation performed by the DMD 80 is guided onto the photosensitive material 150, and the photosensitive material 150 is thus exposed to the light.

Explanation of Elements Constituting the Exposure Head 166

The elements constituting each of the exposure heads 166, 166, . . . will be described hereinbelow. The optical system 50 and the axial air separation adjusting section 54 have the constitutions described above.

Light Source Unit 60

The light source unit 60 comprises a plurality of (e.g., six) laser beam combining light sources 40, 40, . . . The light source unit 60 also comprises a laser beam radiating section 61. The laser beam radiating section 61 units a plurality of optical fibers 31, 31, . . . , each of which is connected to one of multimode optical fibers 30, 30, . . . Each of the multimode optical fibers 30, 30, . . . acts as a constituent element of one of the laser beam combining light sources 40, 40, . . .

Explanation of the Laser Beam Combining Light Source 40

Figure 9:
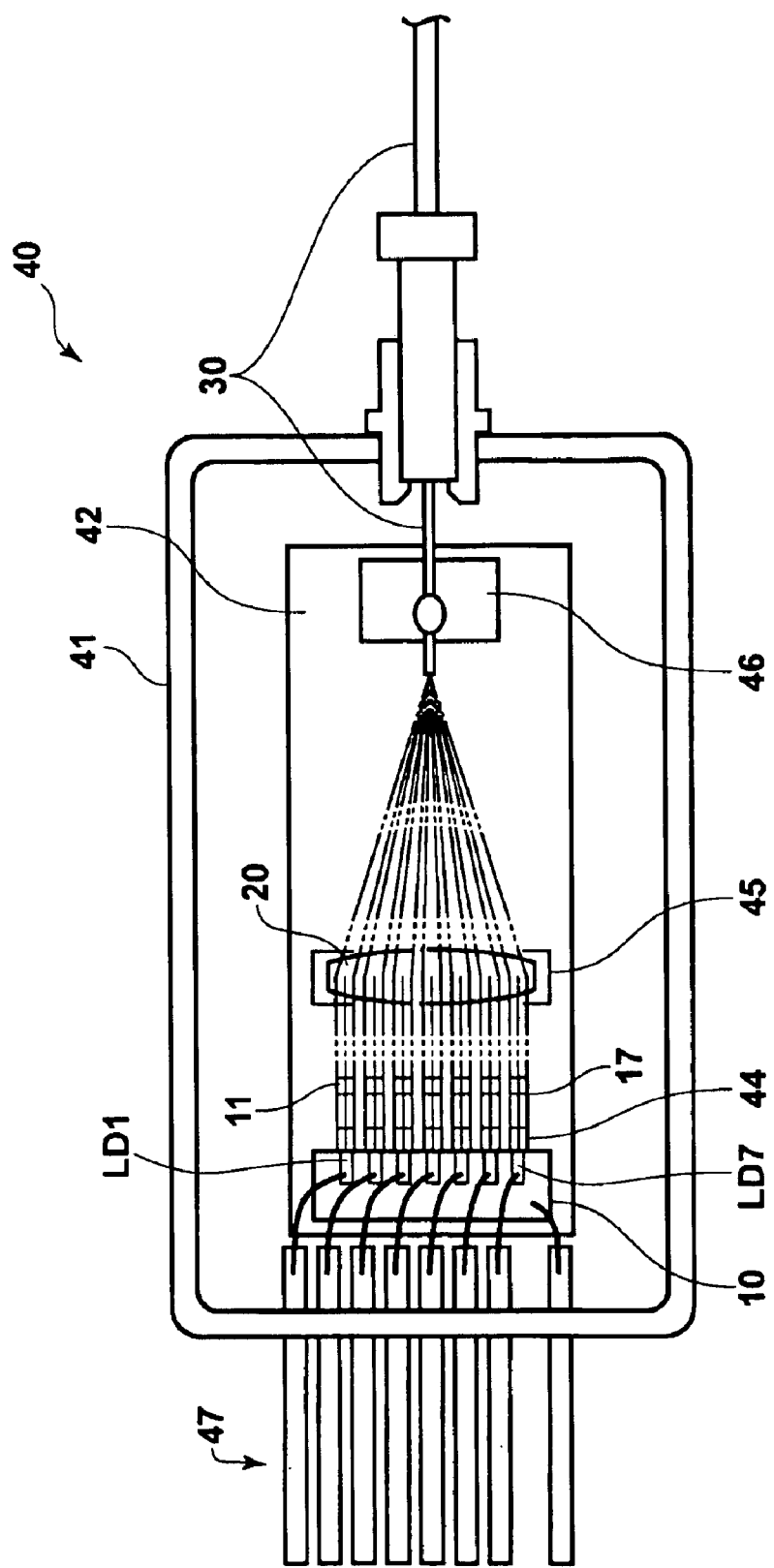
FIG. 9 is a plan view showing a laser beam combining light source.
Figure 10:
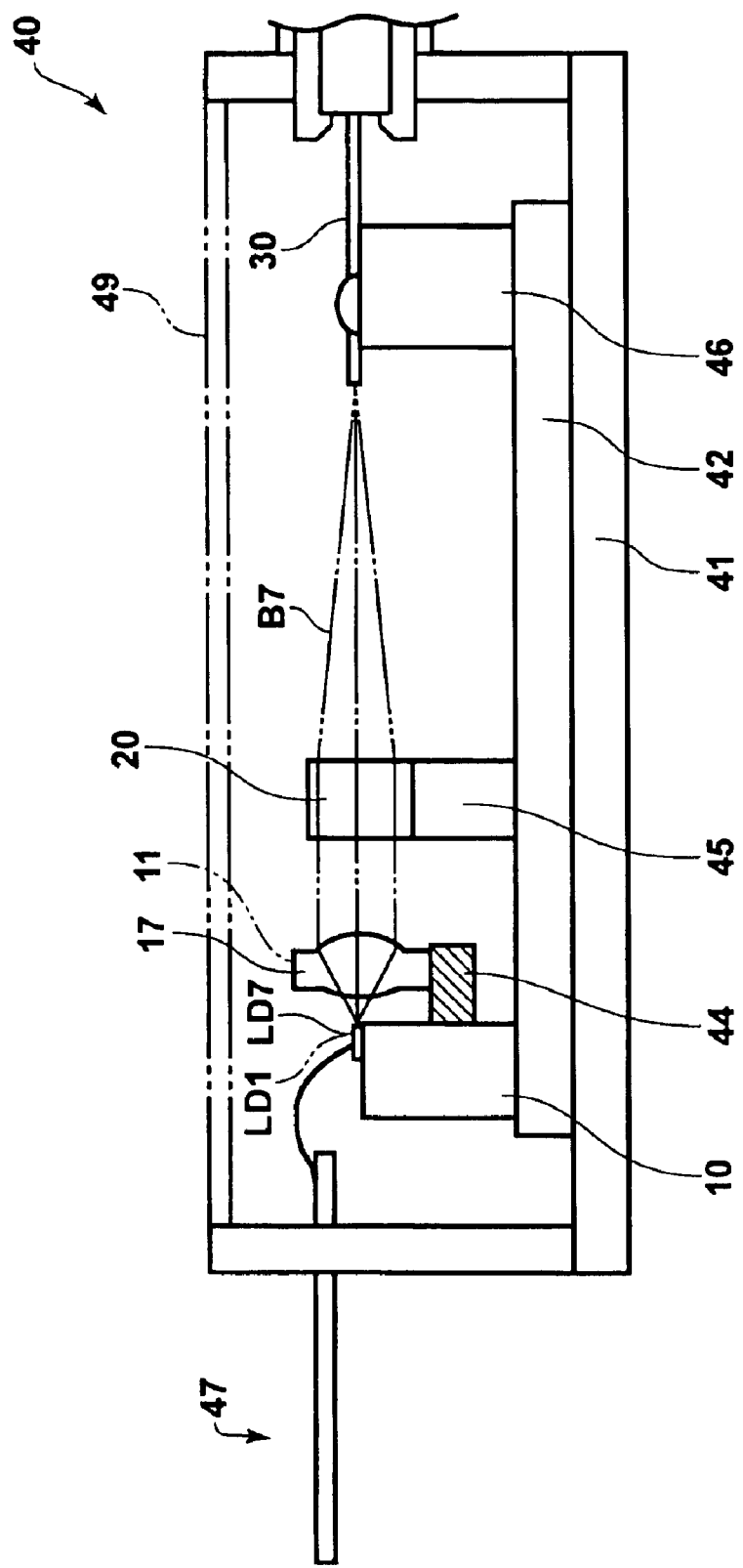
FIG. 10 is a side view showing the laser beam combining light source.
Figure 11:
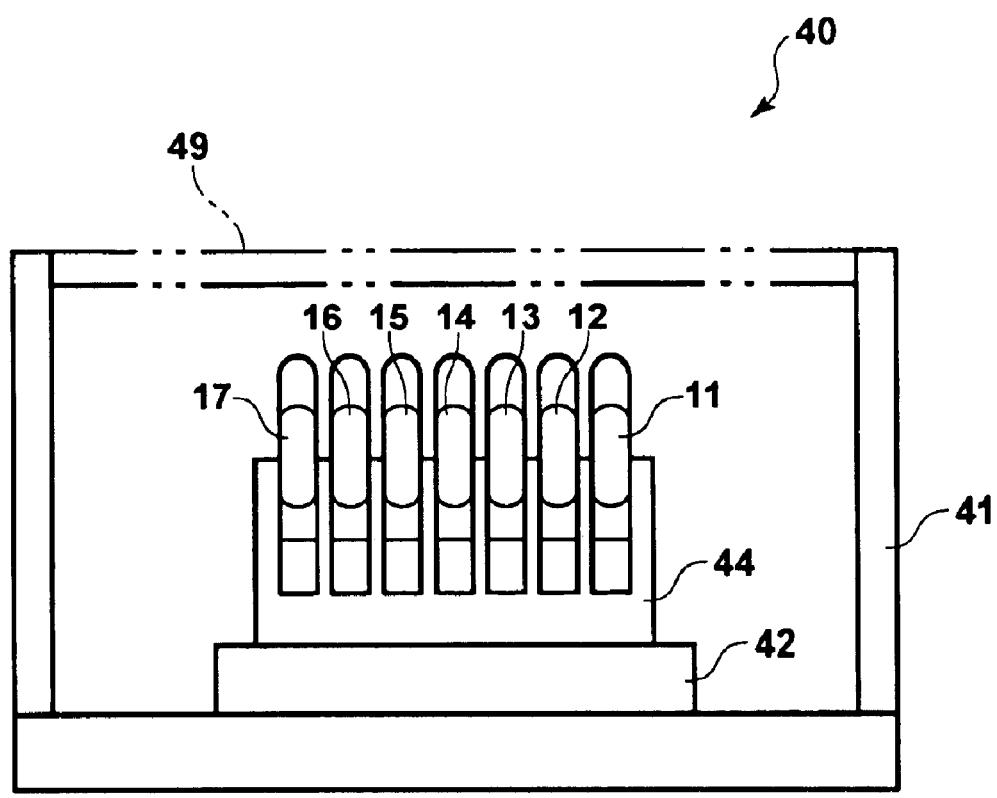
FIG. 11 is a front view showing the laser beam combining light source.

FIG. 9 is a plan view showing a laser beam combining light source. FIG. 10 is a side view showing the laser beam combining light source. FIG. 11 is a front view showing the laser beam combining light source. FIG. 12 is an enlarged plan view showing optical elements of the laser beam combining light source.

Constitution of the Laser Beam Combining Light Source 40

Each of the laser beam combining light sources 40, 40, . . . comprises a plurality of semiconductor lasers LD1, LD2, LD3, LD4, LD5, LD6, and LD7. The laser beam combining light source 40 also comprises the one multimode optical fiber 30. The laser beam combining light source 40 further comprises a combination of collimator lenses 11 to 17 and one converging lens 20. The combination of the collimator lenses 11 to 17 and the converging lens 20 acts as laser beam converging means for converging an entire laser beam, which is composed of laser beams having been produced by the plurality of the semiconductor lasers LD1 to LD7, and irradiating the entire laser beam onto a core region of the multimode optical fiber 30. The laser beams constituting the entire laser beam are combined with one another in the multimode optical fiber 30. The combined laser beam passes through the multimode optical fiber 30 and is radiated out from the multimode optical fiber 30.

More specifically, the laser beam combining light source 40 comprises the plurality of (e.g., seven) chip-like GaN type semiconductor lasers LD1, LD2, LD3, LD4, LD5, LD6, and LD7, which may be of a transverse multimode or a single mode. The GaN type semiconductor lasers LD1, LD2, LD3, LD4, LD5, LD6, and LD7 are arrayed in one direction and secured to a top surface of a heat block 10, which is made from a material having a high heat transfer coefficient, such as copper. The laser beam combining light source 40 also comprises the collimator lenses 11, 12, 13, 14, 15, 16, and 17, which correspond respectively to the GaN type semiconductor lasers LD1, LD2, LD3, LD4, LD5, LD6, and LD7. The laser beam combining light source 40 further comprises the converging lens 20 for converging the entire laser beam, which is composed of the laser beams having been radiated out from the collimator lenses 11 to 17, into one spot. The laser beam combining light source 40 still further comprises the one multimode optical fiber 30 for receiving the entire laser beam, which has been converted by the converging lens 20, and combining the laser beams constituting the entire laser beam with one another.

The number of the semiconductor lasers LD1, LD2, . . . is not limited to seven. For example, laser beams having been produced by 20 semiconductor lasers may be irradiated to a multimode optical fiber, which has a cladding layer diameter of 60 $\mu$m, a core diameter of 50 $\mu$m, and NA of 0.2.

The laser beams produced by the GaN type semiconductor lasers LD1 to LD7 may have an identical wavelength (of, e.g., 405 mn). Also, the GaN type semiconductor lasers LD1 to LD7 may have an identical maximum output power (e.g., 100 mW in the cases of multimode lasers, or 30 mW in the cases of single mode lasers). Alternatively, as the GaN type semiconductor lasers LD1 to LD7, lasers capable of producing laser beams, which have a wavelength other than 405 mn and falling within the blue light wavelength range of 350 mn to 450 mn, may be employed.

As illustrated in FIG. 9, FIG. 10, and FIG. 11, the optical elements of the laser beam combining light source 40 are accommodated within a box-like package 41, which has an opening at the top region. The package 41 is provided with a package cover 49 capable of closing the opening of the package 41. After the box-like package 41 is subjected to deaeration processing, a sealing gas is introduced into the package 41, and the opening of the package 41 is closed by the package cover 49. In this manner, the closed space (sealed space), which is surrounded by the package 41 and the package cover 49, is hermetically sealed.

A base plate 42 is secured to an inside bottom surface of the package 41. The heat block 10 described above, a converging lens holder 45 for supporting the converging lens 20, and a fiber holder 46 for supporting an entry end section of the multimode optical fiber 30 are secured to a top surface of the base plate 42. A radiating end section of the multimode optical fiber 30 is drawn out through an aperture, which is formed through a side wall of the package 41, to the exterior of the package 41.

The temperature of the base plate 42 is adjusted by temperature adjusting means, which utilizes a fluid as a medium, a Peltier device (not shown), or the like. While the projecting exposure apparatus is being operated, the temperature of the base plate 42 is kept at a predetermined value.

A collimator lens holder 44 is secured to a side surface of the heat block 10. The collimator lenses 11 to 17 are supported by the collimator lens holder 44. Also, electric wires 47, 47, . . . for supplying actuating electric currents to the GaN type semiconductor lasers LD1 to LD7 are drawn out through an aperture, which is formed through a side wall of the package 41.

In FIG. 9 and FIG. 10, as an aid in facilitating the explanation, only the GaN type semiconductor lasers LD1 and LD7 among the plurality of the GaN type semiconductor lasers LD1 to LD7 are numbered. Also, only the collimator lenses 11 and 17 among the plurality of the collimator lenses 11 to 17 are numbered.

FIG. 11 is a front view showing the part at which the collimator lenses 11 to 17 are fitted. Each of the collimator lenses 11 to 17 is an aspherical lens and is formed in a slender shape such that a region containing the optical axis of the aspherical lens has been cut along planes parallel to the optical axis. Each of the collimator lenses 11 to 17 having the slender shape may be formed with, for example, a resin shaping process or a glass shaping process. The collimator lenses 11 to 17 are located at positions which are close to one another and which stand side by side along the array direction of light emission points of the GaN type semiconductor lasers LD1 to LD7 (i.e., the horizontal direction in FIG. 11), such that the longitudinal direction of each of the collimator lenses 11 to 17 may be normal to the array direction of the light emission points of the GaN type semiconductor lasers LD1 to LD7 (i.e., the horizontal direction in FIG. 11).

Each of the GaN type semiconductor lasers LD1 to LD7 may be provided with an active layer having a light emission width of 2 μm. The GaN type semiconductor lasers LD1 to LD7 may produce laser beams B1 to B7, respectively, in a state such that a spread angle with respect to the direction parallel to the surface of the active layer is, for example, 10°, and such that the spread angle with respect to the direction normal to the surface of the active layer is, for example, 30°.

Each of the GaN type semiconductor lasers LD1 to LD7 is located in an orientation such that the surface of the active layer may be parallel to the array direction of the light emission points of the GaN type semiconductor lasers LD1 to LD7. Specifically, the direction, which is associated with the large spread angle of each of the laser beams B1 to B7 radiated out respectively from the light emission points described above, coincides with the longitudinal direction of each of the collimator lenses 11 to 17 having the slender shape. Also, the direction, which is associated with the small spread angle of each of the laser beams B1 to B7 radiated out respectively from the light emission points described above, coincides with the lateral direction of each of the collimator lenses 11 to 17.

The length of each of the collimator lenses 11 to 17, which length is taken along the longitudinal direction of each of the collimator lenses 11 to 17, may be equal to 4.6 mm. The width of each of the collimator lenses 11 to 17, which width is taken along the lateral direction of each of the collimator lenses 11 to 17, may be equal to 1.1 mm. Also, the length of a major axis of the elliptic beam shape of each of the laser beams B1 to B7 incident upon the collimator lenses 11 to 17, respectively, may be equal to 2.6 mm. The length of a minor axis of the elliptic beam shape of each of the laser beams B1 to B7 incident upon the collimator lenses 11 to 17, respectively, may be equal to 0.9 mm. Each of the collimator lenses 11 to 17 may be constituted such that a focal length f is equal to 3 mm, NA is equal to 0.6, and a lens array pitch is equal to 1.25 mm.

The converging lens 20 is formed in a slender shape such that a region containing the optical axis of an aspherical lens has been cut along planes parallel to the optical axis. The converging lens 20 is located in an orientation such that the longitudinal direction of the converging lens 20 coincides with the array direction of the collimator lenses 11 to 17, and such that the lateral direction of the converging lens 20 coincides with the direction normal to the array direction of the collimator lenses 11 to 17.

The converging lens 20 is constituted such that a focal length f is equal to 23 mm, and NA is equal to 0.2. The converging lens 20 may be formed with, for example, a resin shaping process or a glass shaping process.

Operation of the Laser Beam Combining Light Source 40

Each of the laser beams B1, B2, B3, B4, B5, B6, and B7, which have been radiated out respectively from the GaN type semiconductor lasers LD1, LD2, LD3, LD4, LD5, LD6, and LD7 constituting the laser beam combining light source 40 described above, is collimated by the corresponding one of the collimator lenses 11 to 17. The laser beams B1 to B7 having thus been collimated are converged by the converging lens 20 and impinge upon the entry end face of a core section 30a of the multimode optical fiber 30.

The laser beams B1 to B7 having thus been collimated by the converging lens 20 enter into the core section 30a of the multimode optical fiber 30 and are combined into a combined laser beam B. The combined laser beam B travels through the multimode optical fiber 30 and is radiated out from a radiating end face of the multimode optical fiber 30. The combined laser beam B having thus been radiated out from the radiating end face of the multimode optical fiber 30 impinges upon an optical fiber 31 connected to the multimode optical fiber 30 as will be described later.

For example, in cases where a coupling efficiency of the laser beams B1 to B7 with the multimode optical fiber 30 is equal to 0.85, and the output power of each of the GaN type semiconductor lasers LD1 to LD7 is equal to 30 mW, the combined laser beam B is capable of being obtained with an output power of 180 mW (=30 mW×0.85×7). The combined laser beam B obtained with the output power described above travels through the multimode optical fiber 30 to the optical fiber 31. Therefore, the output power obtained at the laser beam radiating section 61 described below, at which the six optical fibers 31, 31, . . . connected respectively to the multimode optical fibers 30, 30, . . . of the laser beam combining light sources 40, 40, . . . are united together, becomes equal to approximately 1 W (=180 mW×6).

Laser Beam Radiating Section 61

Figure 14:
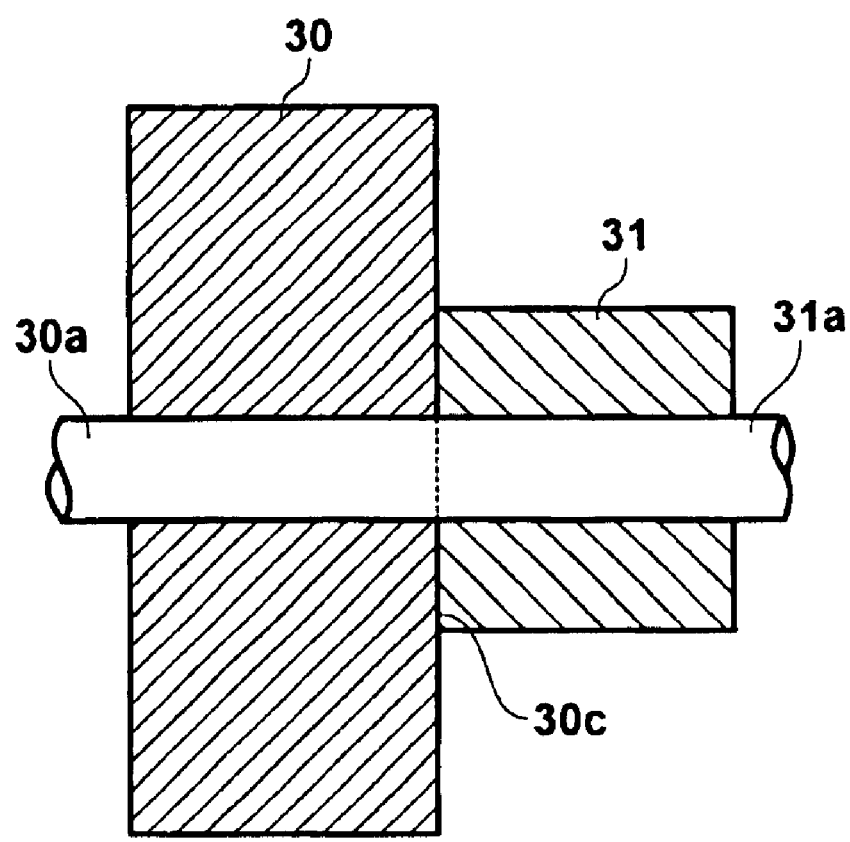
FIG. 14 is a view showing how a multimode optical fiber of the laser beam combining light source and the optical fiber at the laser beam radiating section are connected to each other.

The laser beam radiating section 61 will be described hereinbelow with reference to FIGS. 13A, 13B and FIG. 14. FIG. 13A is a perspective view showing how multimode optical fibers of the laser beam combining light sources are connected to optical fibers of a laser beam radiating section in a light source unit. FIG. 13B is an enlarged view showing a part of the laser beam radiating section. FIG. 13C is a front view showing an example of an array of the optical fibers at the laser beam radiating section. FIG. 13D is a front view showing a different example of an array of the optical fibers at the laser beam radiating section. FIG. 14 is a view showing how the multimode optical fiber of the laser beam combining light source and the optical fiber at the laser beam radiating section are connected to each other.

As illustrated in FIGS. 13A and 13B, the laser beam radiating section 61 described above comprises the optical fibers 31, 31, . . . , support plates 65, 65, and a protective plate 63. The laser beam radiating section 61 is constituted in the manner described below.

As illustrated in FIG. 13A, the radiating end of each of the multimode optical fibers 30, 30, . . . of the laser beam combining light sources 40, 40, . . . is connected to the entry end of the corresponding one of the optical fibers 31, 31, . . . of the laser beam radiating section 61. The entry end of each of the optical fibers 31, 31, . . . has a core diameter, which is identical with the core diameter of the multimode optical fiber 30, and a cladding layer diameter, which is smaller than the cladding layer diameter of the multimode optical fiber 30. Also, as illustrated in FIG. 13C, the radiating ends of the optical fibers 31, 31, . . . are arrayed in a row and thus constitute a radiating end section 68. Alternatively, as illustrated in FIG. 13D, the radiating ends of the optical fibers 31, 31, . . . may be stacked and arrayed in two rows and may thus constitute a radiating end section 68'.

As illustrated in FIG. 13B, the portions of the optical fibers 31, 31, . . . located on the radiating side are sandwiched between the two support plates 65, 65 having flat surfaces and are thus secured in predetermined positions. Also, the protective plate 63, which is transparent and is made from glass, or the like, for protecting the end faces of the optical fibers 31, 31, . . . on the radiating side, is located at the end faces of the optical fibers 31, 31, . . . on the radiating side. The protective plate 63 may be located such that it is in close contact with the radiating end faces of the optical fibers 31, 31, . . . . Alternatively, the protective plate 63 may be located such that it is not in close contact with the radiating end faces of the optical fibers 31, 31, . . .

The connection of the optical fiber 31 and the multimode optical fiber 30 to each other may be made in the manner illustrated in FIG. 14. Specifically, the end face of the optical fiber 31 having the small cladding layer diameter is connected co-axially to a small-diameter region 30c of the end face of the multimode optical fiber 30 having the large cladding layer diameter. The connection may be performed with, for example, a fusion bonding process.

Alternatively, the connection of the optical fiber 31 and the multimode optical fiber 30 to each other may be made in the manner described below. Specifically, a short optical fiber may be prepared with a process, wherein an optical fiber having a short length and a small cladding layer diameter is fusion-bonded to an optical fiber having a short length and a large cladding layer diameter. The short optical fiber may then be connected to the radiating end of the multimode optical fiber 30 via a ferrule, an optical connector, or the like. In cases where the optical fiber 31 and the multimode optical fiber 30 are releasably connected to each other by the utilization of the connector, or the like, the optical fiber having the small cladding layer diameter is capable of being exchanged easily at the time of the breakage, or the like, and the cost required for the maintenance operations for the exposure head is capable of being kept low.

Each of the multimode optical fiber 30 and the optical fiber 31 may be a step index type optical fiber, a graded index type optical fiber, or a composite type optical fiber. For example, a step index type optical fiber, which is supplied by Mitsubishi Densen Kogyo, K.K., may be utilized as each of the multimode optical fiber 30 and the optical fiber 31. In this embodiment, each of the multimode optical fiber 30 and the optical fiber 31 is constituted of the step index type optical fiber.

The multimode optical fiber 30 is constituted such that the cladding layer diameter is equal to 125 μm, the core diameter is equal to 50 μm, NA is equal to 0.2, and the transmittance of the entry end face coating layer is equal to at least 99.5%. The optical fiber 31 is constituted such that the cladding layer diameter is equal to 60 μm, the core diameter is equal to 50 μm, and NA is equal to 0.2.

DMD 80

The DMD 80 will be described hereinbelow. FIG. 15A is a plan view showing how the photosensitive material is exposed to light beams in cases where the DMD is located in an orientation, which is not oblique. FIG. 15B is a plan view showing how the photosensitive material is exposed to the light beams in cases where the DMD is located in an oblique orientation.

As described above with reference to FIG. 1 and FIG. 2, each of the exposure heads 166, 166, . . . is provided with the digital micromirror device (DMD) 80 (shown in FIG. 3) acting as the spatial light modulation means for modulating the incident laser beam in accordance with a predetermined control signal. The DMD 80 is connected to a controller (not shown), which is provided with a signal processing section and a mirror actuation control section. In accordance with a received image signal, the signal processing section of the controller forms the control signal for controlling the actuation of each of the micromirrors 81, 81, . . . of the DMD 80. The control signal is formed for each of the exposure heads 166, 166, . . . Also, in accordance with the control signal having been formed by the signal processing section, the mirror actuation control section of the controller controls the angle of the reflection surface of each of the micromirrors 81, 81, of the DMD 80 of each of the exposure heads 166, 166, . . .

The DMD 80 comprises an array of the micromirrors 81, 81, . . . , which array is composed of a plurality of (e.g., 1,024) columns of the micromirrors 81, 81, . . . standing side by side with respect to the longitudinal direction of the DMD 80 and a plurality of (e.g., 756) rows of the micromirrors 81, 81, . . . standing side by side with respect to the lateral direction of the DMD 80. As illustrated in FIG. 15B, in cases where the DMD 80 is located in an oblique orientation, the pitch of scanning loci (i.e., the sub-scanning lines) along the sub-scanning direction, which are formed with the laser beams having been reflected from the micromirrors 81, 81, . . . of the DMD 80, is capable of being set at a small pitch P2. The pitch P2 is smaller than a pitch P1 obtained in cases where the DMD 80 is located in an orientation, which is not oblique, as illustrated in FIG. 15A. With the setting of the inclination of the DMD 80, the resolution of exposure with the exposure head 166 is capable of being enhanced markedly.

Also, since an identical region of the photosensitive material 150 on the sub-scanning line is capable of being subjected to multiple exposure with different micromirrors 81, 81, . . . , the exposed position is capable of being controlled finely, and a high-definition exposure operation is capable of being performed. Further, joints of the two-dimensional patterns, which are formed with the exposure to the laser beams radiated out from the exposure heads 166, 166, . . . adjacent to one another with respect to the main scanning direction, are capable of being rendered imperceptible.

DMD Irradiation Optical System 70

As illustrated in FIG. 2, the DMD irradiation optical system 70 of each of the exposure heads 166, 166, . . . comprises a collimator lens 71 for approximately collimating the plurality of the laser beams, which have been radiated out from the laser beam radiating section 61 of the light source unit 60, as a whole. The DMD irradiation optical system 70 also comprises a micro fry-eye lens 72, which is located in the optical path of the light having passed through the collimator lens 71. The DMD irradiation optical system 70 further comprises a micro fry-eye lens 73, which is located so as to stand facing the micro fry-eye lens 72. The DMD irradiation optical system 70 still further comprises a field lens 74, which is located on the radiating side of the micro fry-eye lens 73, i.e. on the side facing the mirror 75 described later. The DMD irradiation optical system 70 also comprises the prism 76.

Each of the micro fry-eye lens 72 and the micro fry-eye lens 73 comprises a plurality of fine lens cells, which are arrayed in two-dimensional directions. The laser beams having passed through the fine lens cells impinge in an overlapping state upon the DMD 80 via the mirror 75 and the prism 76. Therefore, the distribution of the intensities of the laser beams impinging upon the DMD 80 is capable of being rendered uniform.

The mirror 75 reflects the laser beams having passed through the field lens 74. Also, the prism 76 is the TIR prism (the total reflection prism) and totally reflects the laser beams, which have been reflected from the mirror 75, toward the DMD 80. In the manner described above, the DMD irradiation optical system 70 irradiates the laser beams, which have the approximately uniform intensity distribution, onto the DMD 80.

Explanation of the Operation of the Projecting Exposure Apparatus

How the aforesaid projecting exposure apparatus operates will be described hereinbelow.

The projecting exposure apparatus is actuated, and the respective sections of the projecting exposure apparatus are set in an operating state. In this state, the temperature of the laser beam combining light sources 40, 40, . . . of each of the exposure heads 166, 166, . . . is adjusted. However, the GaN type semiconductor lasers LD1 to LD7 of each of the laser beam combining light sources 40, 40, . . . are not turned on.

The image signal corresponding to the two-dimensional pattern is fed into the controller (not shown), which is connected to the DMD 80 of each of the exposure heads 166, 166, . . . The image signal is stored in a frame memory of the controller. The image signal represents the image densities of the pixels constituting the image. By way of example, the image signal may represent the image density of each pixel by the binary notation (representing whether a dot is to be or is not to be recorded).

The stage 152 having the surface, on which the photosensitive material 150 has been supported by suction, is moved by the actuating section (not shown) at a predetermined speed from the side more upstream than the scanner support section 160 to the side more downstream than the scanner support section 160 along the guides 158, 158 and under the scanner support section 160. At the time at which the stage 152 passes under the scanner support section 160, the leading end of the photosensitive material 150 is detected by the detection sensors 164, 164, which are secured to the scanner support section 160. After the leading end of the photosensitive material 150 has been detected by the detection sensors 164, 164, the image signal components of the image signal, which has been stored in the frame memory of the controller, are successively read from the frame memory in units of a plurality of scanning lines. In accordance with the thus read image signal components of the image signal, the signal processing section forms the control signal for each of the exposure heads 166, 166, . . .

When preparations for the exposure operation on the photosensitive material 150 has been made, the GaN type semiconductor lasers LD1 to LD7 of each of the laser beam combining light sources 40, 40, . . . of each of the exposure heads 166, 166, . . . are turned on. In accordance with the control signal having been formed by the signal processing section, each of the micromirrors 81, 81, . . . of the DMD 80 of each of the exposure heads 166, 166, . . . is controlled by the mirror actuation control section of the controller. The photosensitive material 150 is thus exposed to the laser beams.

When the laser beams, which have been produced by the laser beam combining light sources 40, 40, . . . and have been radiated out from the laser beam radiating section 61, are irradiated to the DMD 80 via the DMD irradiation optical system 70 in each of the exposure heads 166, 166, . . . , the laser beams are reflected from the micromirrors 81, 81, . . . of the DMD 80, which micromirrors are in the on state. The thus reflected laser beams pass through the optical system 50, and the images of the laser beams are formed on the photosensitive surface 151 of the photosensitive material 150. The images of the laser beams reflected from the micromirrors 81, 81, . . . of the DMD 80, which micromir- rors are in the off state, are not formed on the photosensitive surface 151. Therefore, the photosensitive material 150 is not exposed to the laser beams reflected from the micromirrors 81, 81, . . . of the DMD 80, which micromirrors are in the off state.

In the manner described above, the laser beams, which have been radiated out from the light source unit 60 of each of the exposure heads 166, 166, . . . , are on-off modulated for each of the micromirrors 81, 81, . . . of the DMD 80 (i.e., for each of the pixels). As illustrated in FIG. 7 and FIGS. 8A, 8B, each of the exposure processing areas 168, 168, . . . on the photosensitive material 150 is subjected to the exposure processing performed by one of the exposure heads 166, 166, . . . Also, the photosensitive material 150 is moved in the sub-scanning direction together with the stage 152, and each of the band-shaped exposure-processed regions 170, 170, . . . extending in the sub-scanning direction is formed by one of the exposure heads 166, 166, . . .

Ordinarily, warpage or waviness (warpage or waviness of, for example, approximately 100 $\mu$m) occurs with the photosensitive material 150. Therefore, the separation between each exposure head $166_{mn}$ and the exposure region of the photosensitive material 150, which exposure region is exposed to the laser beams radiated out from the exposure head $166_{mn}$, is detected by separation detecting means (not shown), such as a gap sensor, for detecting the separation in accordance with an alteration in position, from which the laser beams are reflected. Also, information representing the results of the detection of the separation is fed into an axial air separation adjustment control section (not shown), and the axial air separation adjustment control section controls the axial air separation adjusting section 54 in order to correct the alteration in separation described above. In this manner, the adjustment of the axial air separation between the second image forming optical system 52, which is the image-side telecentric image forming optical system, and the photosensitive material 150 is performed.

Use of Part of the DMD 80

Figure 16A:
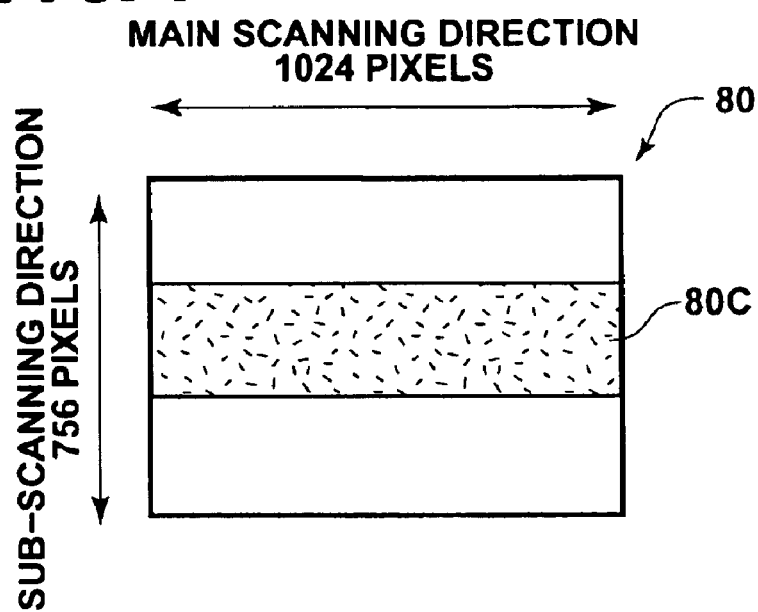
FIG. 16A is an explanatory view showing an example of a used region in the DMD.
Figure 16B:
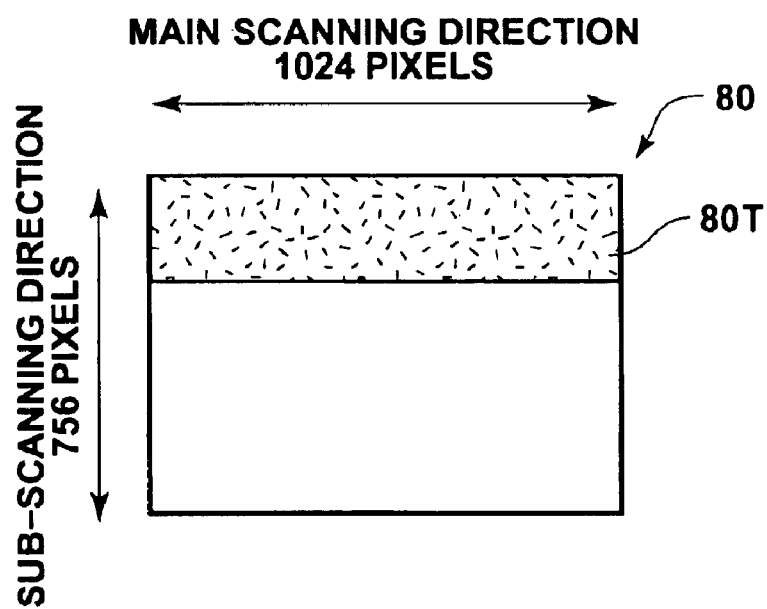
FIG. 16B is an explanatory view showing a different example of a used region in the DMD.

In this embodiment, as illustrated in FIGS. 16A and 16B, the DMD 80 comprises the array of the micromirrors 81, 81, . . . , which array is composed of the plurality of (e.g., 1,024) columns (pixels) of the micromirrors 81, 81, . . . standing side by side with respect to the longitudinal direction of the DMD 80 (corresponding to the main scanning direction in the exposure operation) and a plurality of (e.g., 756) rows (pixels) of the micromirrors 81, 81, . . . standing side by side with respect to the lateral direction of the DMD 80 (corresponding to the sub-scanning direction in the exposure operation). However, in this embodiment, the controller controls such that only certain rows of the micromirrors 81, 81, . . . (e.g., 1,024 micromirrors×300 rows) are actuated.

For example, as illustrated in FIG. 16A, only the micromirrors 81, 81, . . . located in an array region 80C of the DMD 80, which array region is constituted of certain middle rows, may be actuated. Alternatively, as illustrated in FIG. 16B, only the micromirrors 81, 81, . . . located in an array region 80T of the DMD 80, which array region is constituted of certain rows at an end area, may be actuated. Also, in cases where a failure occurs with a certain micromirror 81, the micromirrors 81, 81, . . . located in an array region other than the array region containing the defective micromirror 81 may be utilized. In this manner, the array region of the DMD 80 to be used may be altered in accordance with the condition of the operation.

Specifically, limitation is imposed upon the signal processing speed for the DMD 80, and the modulation speed per scanning line is determined in proportion to the number of the micromirrors 81, 81, . . . to be controlled (i.e., the number of the pixels). Therefore, in cases where only the micromirrors 81, 81, . . . located within a certain part of the array region of the DMD 80 are used, the modulation speed per scanning line is capable of being kept high. In such cases, since only part of the pixel sections constituting the DMD 80 is used, the processing width in the sub-scanning direction is capable of being kept narrow. Therefore, the distance of the movement of the wedge-shaped prism 540B with respect to the wedge-shaped prism 540A is capable of being kept short. Also, in cases where the processing width, over which the adjustment of the focusing point is to be performed, is kept narrow, the waviness occurring with the region of the photosensitive material 150, which region has the narrow width, is capable of being kept small. Therefore, the adjustment of the focusing point is capable of being performed more accurately.

In cases where the region of the DMD 80, which region is used in the manner described above, is altered, the regions of the formation of the image of the two-dimensional pattern on the photosensitive material 150, which image is formed by the optical system 50, alter in accordance with the alteration of the region of the DMD 80, which region is used. Therefore, in such cases, the location of the axial air separation adjusting section 54 should preferably be altered, such that the direction of the movement of the sliding section 545 may coincide with the direction associated with the minimum width of each of the regions of the formation of the image of the two-dimensional pattern, which image is formed on the photosensitive material 150.

When the exposure operation performed in accordance with the image signal having been stored in the frame memory of the controller connected to the DMD 80 is finished, the GaN type semiconductor lasers LD1 to LD7 are turned off, and the radiating of the laser beams from the laser beam combining light sources 40, 40, . . . is ceased. Thereafter, the scanning operation performed by the scanner unit 162 for the photosensitive material 150 in the sub-scanning direction is finished, and the tail end of the photosensitive material 150 is detected by the detection sensors 164, 164. When the tail end of the photosensitive material 150 has thus been detected by the detection sensors 164, 164, the stage 152 is returned by the actuating section (not shown) along the guides 158, 158 to the original position, which is located at the most upstream side with respect to the scanner support section 160. In cases where the next exposure operation is to be performed, the stage 152 is again moved along the guides 158, 158 from the side more upstream than the scanner support section 160 to the side more downstream than the scanner support section 160.

In this embodiment, the microlens array 55 provided with the microlenses 55*a*, 55*a*, . . . for transmitting the light beams La, La, . . . , each of which corresponds to one of the pixel sections described above and has passed through the first image forming optical system 51, is located within the optical system 50. However, the microlens array 55 need not necessarily be utilized in the optical system 50. With an embodiment wherein the microlens array 55 is not utilized, by the provision of the axial air separation adjusting section 54, the effects of enabling the adjustment of the focusing point at the time of the projection of the two-dimensional pattern of the light onto the photosensitive material 150 to be performed easily and quickly are capable of being obtained.

FIG. 17 is a side view showing a different embodiment of the projecting exposure apparatus in accordance with the present invention, wherein an axial air separation adjusting section is located between a microlens array and a second image forming optical system, which is an image-side telecentric image forming optical system. As illustrated in FIG. 17, in each of exposure heads 166', 166', . . . , an optical system 50' may be constituted such that the axial air separation adjusting section 54 may be located between the microlens array 55 and the second image forming optical system 52, which is the image-side telecentric image forming optical system. In this manner, the axial air separation between the microlens array 55 and the second image forming optical system 52 may be altered, and the adjustment of the focusing point at the time of the formation of the image of the two-dimensional pattern on the photosensitive material 150 may thus be performed. With the embodiment of FIG. 17, the same effects as those described above are capable of being obtained. Also, in cases where the optical system 50' is constituted as a magnifying optical system, the size of the region for transmitting the light representing the two-dimensional pattern is capable of being kept small. Therefore, in cases where the axial air separation adjusting section 54 is located between the microlens array 55 and the second image forming optical system 52, the size of the axial air separation adjusting section 54 is capable of being kept smaller than in cases where the axial air separation adjusting section 54 is located between the second image forming optical system 52 and the photosensitive material 150.

With the projecting exposure apparatus in accordance with the present invention, no limitation is imposed upon the wavelengths of the light used for the exposure operation, and the exposure operation with light having wavelengths falling within various wavelength regions is capable of being performed. Also, no limitation is imposed upon the technique for irradiating the light to the spatial light modulation means, the kind of the light source, or the like.

Further, the axial air separation adjusting section is not limited to the axial air separation adjusting section 54 constituted of the wedge-shaped prism pair 540. For example, the axial air separation adjusting section may be constituted in the manner described below. Specifically, a plane-parallel plate comprising two glass plates and a liquid filled between the two glass plates may be utilized. The separation between the two glass plates may be altered by the utilization of a motor, a piezo-electric device, or the like. In this manner, the axial air separation may be adjusted.

What is claimed is:

1. A projecting exposure apparatus, comprising:
   i) spatial light modulation means for performing spatial light modulation of light, which has been produced by a light source, and thereby forming a two-dimensional pattern of the light, and
   ii) an image-side telecentric image forming optical system for forming an image of the two-dimensional pattern of the light, which has been obtained from the spatial light modulation performed by the spatial light modulation means, on a photosensitive material,
   the two-dimensional pattern of the light being projected onto the photosensitive material, the photosensitive material being thus exposed to the two-dimensional pattern of the light,
   wherein the projecting exposure apparatus further comprises axial air separation adjusting means, which is located between the image forming optical system and the photosensitive material, and which alters an axial air separation between the image forming optical system and the photosensitive material and thereby adjusts a focusing point at the time of the formation of the image of the two-dimensional pattern of the light.

2. A projecting exposure apparatus, comprising:

i) spatial light modulation means provided with a plurality of pixel sections arrayed in two-dimensional directions, which pixel sections modulate incident light in accordance with a predetermined control signal, the spatial light modulation means performing spatial light modulation of the light with the plurality of the pixel sections, ii) a first image forming optical system for forming an image of a two-dimensional pattern of the light, which has been obtained from the spatial light modulation performed by the spatial light modulation means, iii) a microlens array located in the vicinity of a plane of image formation of the two-dimensional pattern, whose image is formed by the first image forming optical system, the microlens array being provided with a plurality of microlenses arrayed in two-dimensional directions, each of which microlenses transmits one of light beams corresponding respectively to the pixel sections of the spatial light modulation means and having passed through the first image forming optical system, and iv) a second image forming optical system, which is an image-side telecentric image forming optical system, the second image forming optical system forming an image of each of the light beams, which have passed through the microlens array, on a photosensitive material, the two-dimensional pattern of the light being projected onto the photosensitive material, the photosensitive material being thus exposed to the two-dimensional pattern of the light, wherein the projecting exposure apparatus further comprises axial air separation adjusting means, which is located between the second image forming optical system and the photosensitive material, and which alters an axial air separation between the second image forming optical system and the photosensitive material and thereby adjusts a focusing point at the time of the formation of the image of the two-dimensional pattern of the light.

3. A projecting exposure apparatus, comprising:

i) spatial light modulation means provided with a plurality of pixel sections arrayed in two-dimensional directions, which pixel sections modulate incident light in accordance with a predetermined control signal, the spatial light modulation means performing spatial light modulation of the light with the plurality of the pixel sections, ii) a first image forming optical system for forming an image of a two-dimensional pattern of the light, which has been obtained from the spatial light modulation performed by the spatial light modulation means, iii) a microlens array located in the vicinity of a plane of image formation of the two-dimensional pattern, whose image is formed by the first image forming optical system, the microlens array being provided with a plurality of microlenses arrayed in two-dimensional directions, each of which microlenses transmits one of light beams corresponding respectively to the pixel sections of the spatial light modulation means and having passed through the first image forming optical system, and iv) a second image forming optical system, which is an image-side telecentric image forming optical system, the second image forming optical system forming an image of each of the light beams, which have passed through the microlens array, on a photosensitive material, the two-dimensional pattern of the light being projected onto the photosensitive material, the photosensitive material being thus exposed to the two-dimensional pattern of the light, wherein the projecting exposure apparatus further comprises axial air separation adjusting means, which is located between the microlens array and the second image forming optical system, and which alters an axial air separation between the microlens array and the second image forming optical system and thereby adjusts a focusing point at the time of the formation of the image of the two-dimensional pattern of the light.

4. An apparatus as defined in claim 1 wherein the axial air separation adjusting means is provided with a wedge-shaped prism pair and adjusts the focusing point by moving a position of one of wedge-shaped prisms, which constitute the wedge-shaped prism pair, with respect to the position of the other wedge-shaped prism and in a direction, which is associated with a minimum width of each of regions of the formation of the image of the two-dimensional pattern on the photosensitive material.

5. An apparatus as defined in claim 2 wherein the axial air separation adjusting means is provided with a wedge-shaped prism pair and adjusts the focusing point by moving a position of one of wedge-shaped prisms, which constitute the wedge-shaped prism pair, with respect to the position of the other wedge-shaped prism and in a direction, which is associated with a minimum width of each of regions of the formation of the image of the two-dimensional pattern on the photosensitive material.

6. An apparatus as defined in claim 3 wherein the axial air separation adjusting means is provided with a wedge-shaped prism pair and adjusts the focusing point by moving a position of one of wedge-shaped prisms, which constitute the wedge-shaped prism pair, with respect to the position of the other wedge-shaped prism and in a direction, which is associated with a minimum width of each of regions of the formation of the image of the two-dimensional pattern on the photosensitive material.

7. An apparatus as defined in claim 1 wherein the spatial light modulation means is a digital micromirror device.

8. An apparatus as defined in claim 2 wherein the spatial light modulation means is a digital micromirror device.

9. An apparatus as defined in claim 3 wherein the spatial light modulation means is a digital micromirror device.

10. An apparatus as defined in claim 4 wherein the spatial light modulation means is a digital micromirror device.

11. An apparatus as defined in claim 5 wherein the spatial light modulation means is a digital micromirror device.

12. An apparatus as defined in claim 6 wherein the spatial light modulation means is a digital micromirror device.

13. An apparatus as defined in claim 7 wherein the digital micromirror device performs the spatial light modulation by use of only a part of the plurality of the pixel sections, which constitute the digital micromirror device and are arrayed in the two-dimensional directions.

14. An apparatus as defined in claim 8 wherein the digital micromirror device performs the spatial light modulation by use of only a part of the plurality of the pixel sections, which constitute the digital micromirror device and are arrayed in the two-dimensional directions.

15. An apparatus as defined in claim 9 wherein the digital micromirror device performs the spatial light modulation by use of only a part of the plurality of the pixel sections, which constitute the digital micromirror device and are arrayed in the two-dimensional directions.

16. An apparatus as defined in claim 10 wherein the digital micromirror device performs the spatial light modulation by use of only a part of the plurality of the pixel sections, which constitute the digital micromirror device and are arrayed in the two-dimensional directions.

17. An apparatus as defined in claim 11 wherein the digital micromirror device performs the spatial light modulation by use of only a part of the plurality of the pixel sections, which constitute the digital micromirror device and are arrayed in the two-dimensional directions.

18. An apparatus as defined in claim 12 wherein the digital micromirror device performs the spatial light modulation by use of only a part of the plurality of the pixel sections, which constitute the digital micromirror device and are arrayed in the two-dimensional directions.

* * * * *